US012150279B2

(12) United States Patent
Rush et al.

(10) Patent No.: US 12,150,279 B2
(45) Date of Patent: Nov. 19, 2024

(54) SYSTEMS AND METHODS FOR USING ADDITIVE MANUFACTURING FOR THERMAL MANAGEMENT

(71) Applicant: General Electric Company, Schenectady, NY (US)

(72) Inventors: Brian Magann Rush, Niskayuna, NY (US); William Dwight Gerstler, Niskayuna, NY (US); Stefano Angelo Mario Lassini, Lowell, MI (US); Todd Garrett Wetzel, Niskayuna, NY (US)

(73) Assignee: General Electric Company, Evendale, OH (US)

( * ) Notice: Subject to any disclaimer, the term of this patent is extended or adjusted under 35 U.S.C. 154(b) by 595 days.

(21) Appl. No.: 16/845,381

(22) Filed: Apr. 10, 2020

(65) Prior Publication Data
US 2020/0281095 A1    Sep. 3, 2020

Related U.S. Application Data

(63) Continuation of application No. 14/592,387, filed on Jan. 8, 2015, now Pat. No. 10,660,236.
(Continued)

(51) Int. Cl.
*H05K 7/20*    (2006.01)
*F28D 15/02*   (2006.01)
(Continued)

(52) U.S. Cl.
CPC ..... *H05K 7/20336* (2013.01); *F28D 15/0233* (2013.01); *F28D 15/046* (2013.01);
(Continued)

(58) Field of Classification Search
CPC ............ H05K 7/20336; H05K 7/20672; F28D 15/0233; F28D 15/046; G06F 1/20; G06F 2200/201; B33Y 80/00
(Continued)

(56) References Cited

U.S. PATENT DOCUMENTS 4,366,526 A    12/1982   Lijoi et al.
4,419,044 A    12/1983   Barry et al.
(Continued)

FOREIGN PATENT DOCUMENTS

DE    102011086786 B3    3/2013
JP       H06-21290 A     1/1994
(Continued)

OTHER PUBLICATIONS

European Patent Office Action in EP Application No. 20163552.1 dated Apr. 21, 2022.
(Continued)

*Primary Examiner* — Zhengfu J Feng
(74) *Attorney, Agent, or Firm* — Dinsmore & Shohl LLP

(57) ABSTRACT

According to one embodiment, a thermal management system for electronic devices, including a heat frame, a conformal slot portion, chassis frame, and heat fins wherein the heat frame, conformal slot, chassis frame, and heat fins are integrally formed as a unitary structure by additive manufacturing. In another example, there is a modular vapor assembly for electronic components having a vapor chamber comprising a component surface and a top surface with a vapor channel formed therebetween with at least one liquid receptacle and having a wick structure on at least some of an interior of the component surface. In operation, there is a circuit card with at least some of the electronic components coupled to the vapor chamber component surface and the wick structures transfer at least some of the liquid from the receptacle towards the electronic components, wherein the liquid turns to a vapor that moves towards the receptacle.

14 Claims, 19 Drawing Sheets

Related U.S. Application Data

(60) Provisional application No. 61/976,649, filed on Apr. 8, 2014.

(51) Int. Cl.
*F28D 15/04* (2006.01)
*G06F 1/20* (2006.01)
*B33Y 80/00* (2015.01)

(52) U.S. Cl.
CPC ............ *G06F 1/20* (2013.01); *H05K 7/20672* (2013.01); *B33Y 80/00* (2014.12); *G06F 2200/201* (2013.01)

(58) Field of Classification Search
USPC ........................................................ 361/700
See application file for complete search history.

(56) References Cited

U.S. PATENT DOCUMENTS

| | | | |
|---|---|---|---|
| 4,771,365 A | 9/1988 | Cichocki et al. | |
| 5,227,957 A | 7/1993 | Deters | |
| 5,579,830 A | 12/1996 | Giammaruti | |
| 6,233,150 B1 | 5/2001 | Lin et al. | |
| 6,237,223 B1 | 5/2001 | McCullough | |
| 6,269,866 B1* | 8/2001 | Yamamoto | F28D 15/0233 |
| | | | 174/15.2 |
| 6,359,218 B1 | 3/2002 | Koch et al. | |
| 6,392,883 B1 | 5/2002 | Ali | |
| 6,624,349 B1 | 9/2003 | Bass | |
| 6,631,755 B1 | 10/2003 | Kung et al. | |
| 7,256,992 B1 | 8/2007 | Stewart et al. | |
| 7,473,995 B2 | 1/2009 | Rumer et al. | |
| 7,848,624 B1 | 12/2010 | Zimbeck et al. | |
| 8,921,702 B1* | 12/2014 | Carter | H05K 1/0272 |
| | | | 361/689 |
| 8,937,384 B2 | 1/2015 | Bao et al. | |
| 9,476,651 B2 | 10/2016 | Thiagarajan et al. | |
| 2002/0021556 A1 | 2/2002 | Dibene, II et al. | |
| 2003/0043547 A1 | 3/2003 | Nealis | |
| 2005/0050877 A1 | 3/2005 | Venkataramani et al. | |
| 2005/0199376 A1* | 9/2005 | Lee | F28D 15/046 |
| | | | 165/104.26 |
| 2005/0280162 A1 | 12/2005 | Mok et al. | |
| 2006/0042224 A1 | 3/2006 | Shiao et al. | |
| 2007/0012429 A1 | 1/2007 | Siu | |
| 2007/0193723 A1* | 8/2007 | Hou | F28D 15/0233 |
| | | | 165/146 |
| 2008/0053640 A1 | 3/2008 | Mok | |
| 2009/0040726 A1* | 2/2009 | Hoffman | F28D 15/0233 |
| | | | 29/890.032 |
| 2009/0244830 A1 | 10/2009 | Wyatt et al. | |
| 2010/0006132 A1 | 1/2010 | Hodes | |
| 2010/0181048 A1 | 7/2010 | Hwang et al. | |
| 2010/0320187 A1 | 12/2010 | Griffin et al. | |
| 2011/0232877 A1* | 9/2011 | Meyer, IV | F28D 15/046 |
| | | | 165/104.33 |
| 2012/0020017 A1 | 1/2012 | Kehret et al. | |
| 2012/0192574 A1 | 8/2012 | Ghoshal et al. | |
| 2012/0227926 A1 | 9/2012 | Field et al. | |
| 2012/0250259 A1 | 10/2012 | Lee et al. | |
| 2013/0189594 A1 | 7/2013 | Breit et al. | |
| 2014/0083651 A1 | 3/2014 | Chaix et al. | |
| 2014/0090808 A1 | 4/2014 | Bessho et al. | |
| 2014/0190667 A1 | 7/2014 | McGlen et al. | |
| 2014/0284020 A1 | 9/2014 | Amir et al. | |
| 2015/0040888 A1 | 2/2015 | Zakhidov et al. | |
| 2015/0237762 A1* | 8/2015 | Holt | F28D 15/02 |
| | | | 29/890.032 |
| 2016/0305279 A1 | 10/2016 | Gerstler et al. | |
| 2017/0067693 A1 | 3/2017 | Rush et al. | |

FOREIGN PATENT DOCUMENTS

| | | | | |
|---|---|---|---|---|
| JP | H10-267571 A | | 10/1998 | |
| JP | 2000035294 A | * | 2/2000 | ............ F28D 15/02 |
| JP | 2004146627 A | * | 5/2004 | ............ H01L 23/40 |
| WO | 2009120613 A1 | | 10/2009 | |
| WO | 2013097031 A2 | | 7/2013 | |

OTHER PUBLICATIONS

Mochizuki et al., "A Review of Heat Pipe Application Including New Opportunities", Frontiers in Heat Pipes, vol. No. 2, pp. 1-15, 2011.

Robak, "Latent Heat Thermal Energy Storage with Embedded Heat Pipes for Concentrating Solar Power Applications", University of Connecticut Digital Commons, pp. 1-57, Apr. 24, 2012.

Green et al., "Dynamic Thermal Management of High Heat Flux Devices using Embedded Solid-Liquid Phase Change Materials and Solid State Coolers", 13th IEEE Itherm Conference, pp. 853-863, 2012.

Yogev et al.,"PCM Storage System with Integrated Active Heat Pipe", Energy Procedia, vol. No. 49, pp. 1061-1070, 2014.

Winter, "Engineers' Guide to Military, Aerospace & Avionics", Extension Media, pp. 1-40, 2014.

De Bock et al.," Circuit Card Cartridge For An Electronic System", GE Co-pending U.S. Appl. No. 14/592,387, filed on Aug. 4, 2016.

Non-Final Rejection towards related U.S. Appl. No. 15/228,336 dated May 9, 2017.

"Subracks", Pixus Technologies, Retrieved from http:www.pixustechnologies.com/products/enclosure-system-solutions/subracks/?gclid=CKS30usLjsUCFYMpjgodzIMA8g, pp. 1-13, Aug. 24, 2017.

Machine Translation and Notification of Reasons for Refusal issued in connection with corresponding JP Application No. 2015-076415 on Nov. 27, 2018.

Extended European Search Report for Application No. 20163552.1 dated Jul. 9, 2024 (10 pages).

\* cited by examiner

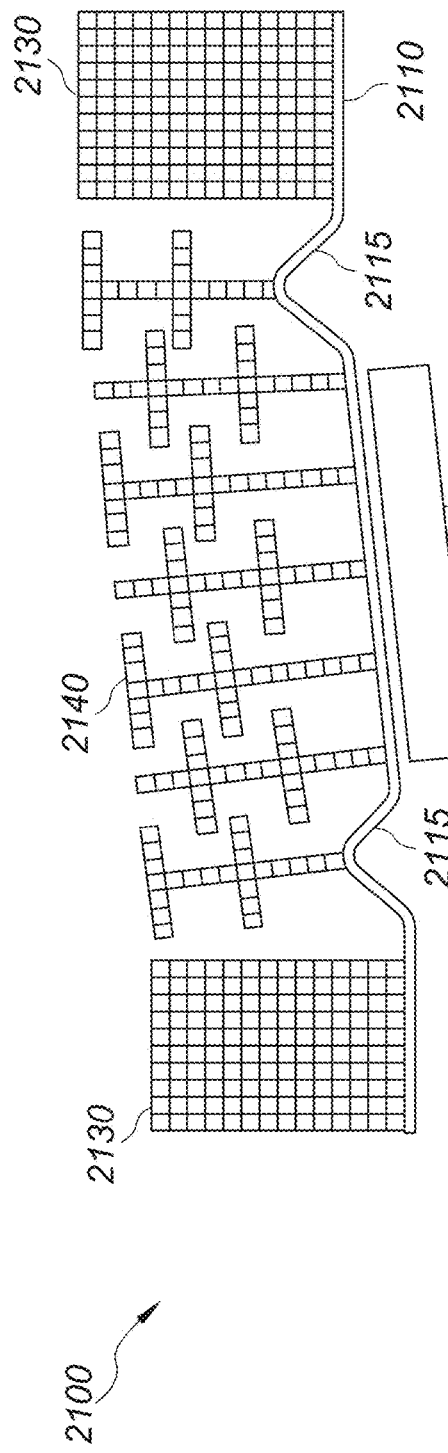
*Fig. 21A*
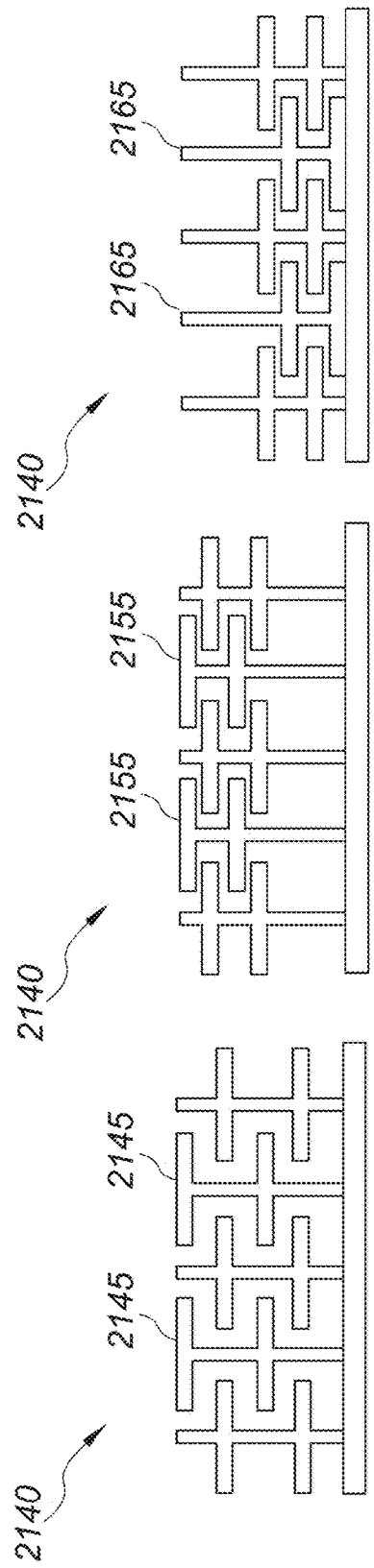
*Fig. 21B*
*Fig. 21C*
*Fig. 21D*

SYSTEMS AND METHODS FOR USING ADDITIVE MANUFACTURING FOR THERMAL MANAGEMENT

CROSS REFERENCE TO RELATED APPLICATION

This application is a continuation of U.S. application Ser. No. 14/592,387, filed Jan. 8, 2015, now allowed, which claims the benefit of U.S. Provisional Application No. 61/976,649, filed Apr. 8, 2014.

BACKGROUND

The operation of electronic devices requires satisfactory thermal management to ensure proper function. As the electronic devices become heated, the devices suffer from device degradation, functional failure, and lower lifespan.

For example, the capability of avionics electronics is determined by the computing processing ability of the system. Typically there are size and weight constraints for an avionics system. These systems are thermally limited such that, for a given volume, only a certain number of cores or processors can operate before thermal issues such as overheating occurs. Typically, processors are de-rated (up to 80%) to avoid overheating in high ambient temperature environments—drastically reducing capability. If the heat can be effectively removed from the system, more processing power, and ultimately more processing capability, is possible from the same volume and weight.

There are a number of conventional cooling methods such as fans and heatsinks that are currently used to remove heat from the electronic circuitry and maintain the operational temperature range for the electronics. Technological improvements have continued to increase the device density and reduce packaging while also increasing the computing power and functionality such that thermal management systems are a key operational element. In addition, certain applications have restrictions in the size and weight that limit the cooling capacity and therefore limit the processing power and functionality of the electronics.

Some improved advances include heat pipes and synthetic jet cooling. Heat pipes provide for some efficiency improvements in the thermal characteristics whereas synthetic jets essentially provide for improved reliability relative to fans.

System designers have increasingly recognized that the thermal management is a critical factor to the successful deployment of electronics and currently design assemblies and systems in order to optimize thermal performance.

The thermal path from the electronic component to the cold reservoir is limited by current technology. Certain conventional designs include the use of milled aluminum heat frames, composite materials for chassis and mounting electronics closer to the cold reservoir. Further aspects include integrating planar vapor chambers and linear heat pipes into a heat spreader structure.

What is needed to further enhance processing power and functionality is to improve the thermal performance.

SUMMARY

The thermal management system for electronics according to one example includes a heatframe, heat fins and/or heat exchanger, chassis portion and conformal slot portion integrally formed as a vapor chamber by 3D printing. In further embodiments, any 3D vapor chamber formed by the additive manufacturing processes as detailed herein is within the scope of the system. A further example includes a heat exchanger or cold plate that interfaces with the vapor chamber or chassis. In certain embodiments, the 3D vapor chamber has a 3D wick structure formed on internal surfaces. There can also be 3D support structures integrated into the 3D vapor chamber, wherein the support structures in one example facilitate the transfer of liquids and gas.

In one example, the vapor chambers are modular such that multiple chambers are coupled together to form a chassis. The chassis can include an input/output (I/O) interface that electrically connects the electronics on a circuit card to the external environment.

A further embodiment is a closed 3D vapor chamber having a heatframe with a component side and an opposing side with a vapor channel formed therebetween. There is at least one liquid receptacle on a first side end of the vapor channel, and typically a liquid receptacle on the opposing side end. A plurality of wick structures are interiorly disposed on at least some of the component side and the opposing side and heat fins and/or heat exchanger is disposed on an exterior of the 3D vapor chamber.

These and other aspects, features, and advantages of this disclosure will become apparent from the following detailed description of the various aspects of the disclosure taken in conjunction with the accompanying drawings.

DRAWINGS

Embodiments described herein will become better understood when the following detailed description is read with reference to the accompanying drawings in which like characters represent like parts throughout the drawings, wherein.

Figure 12A:
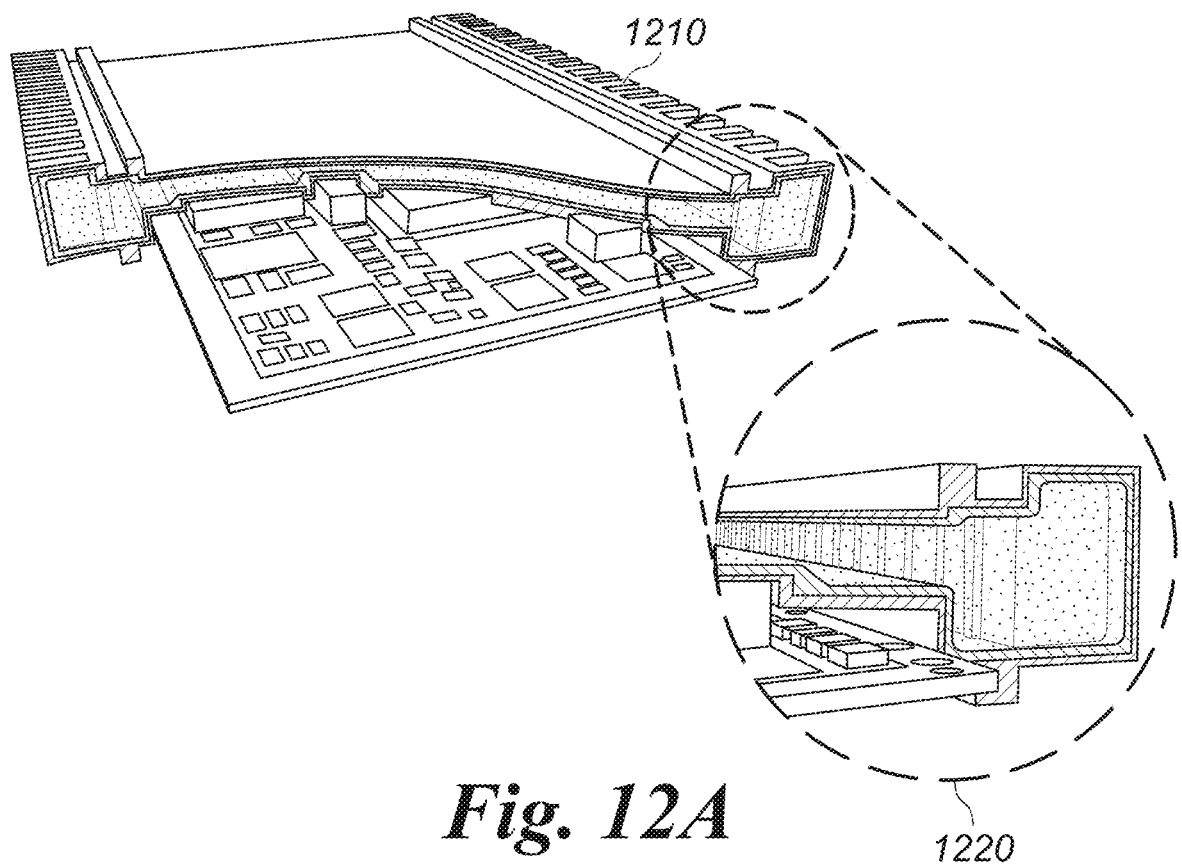
Figure 12B:
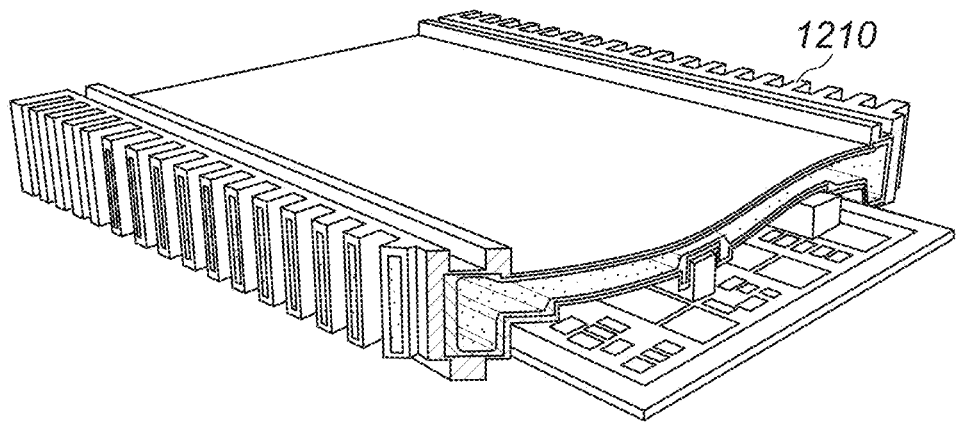
Figure 13:
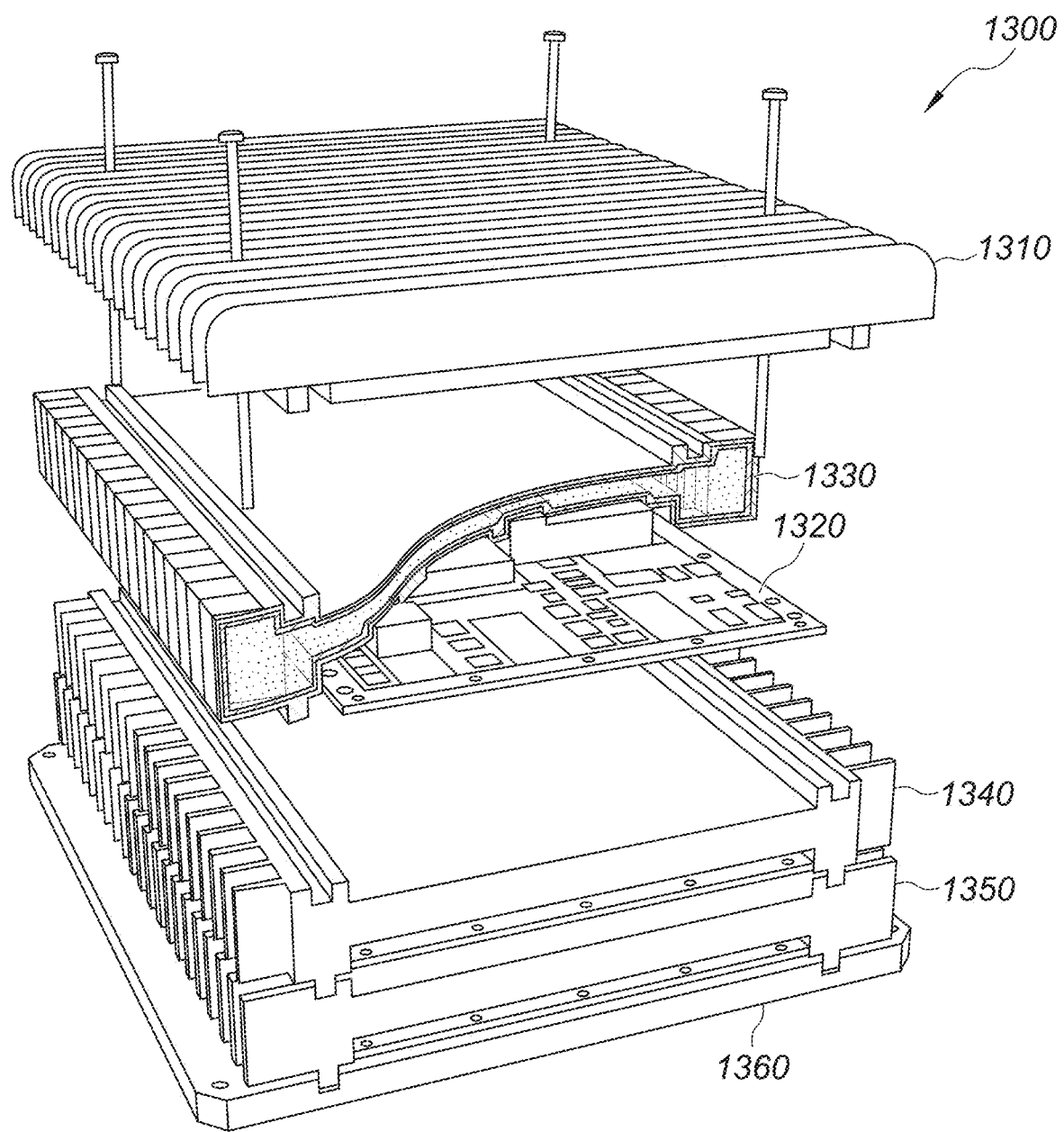
Figure 15:
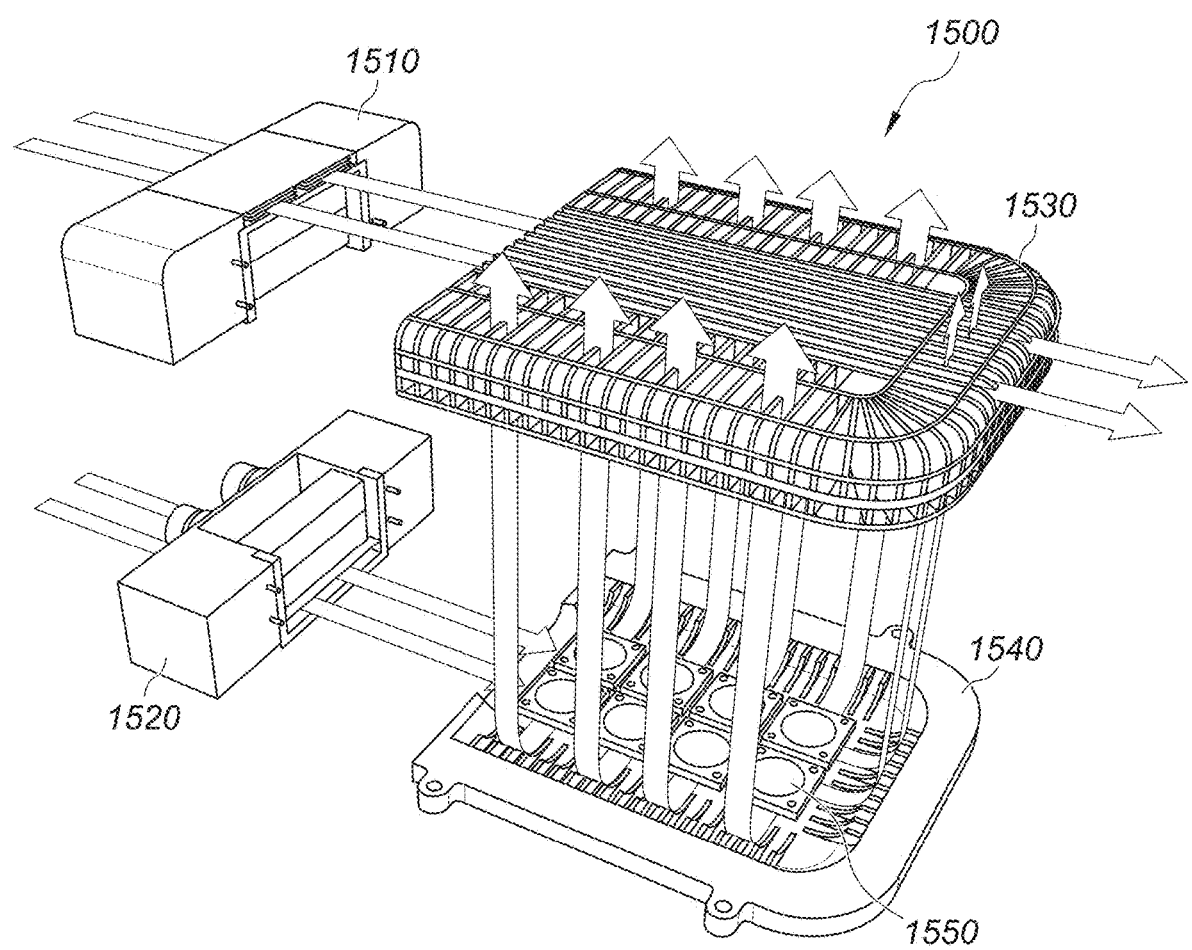
Figure 16A:
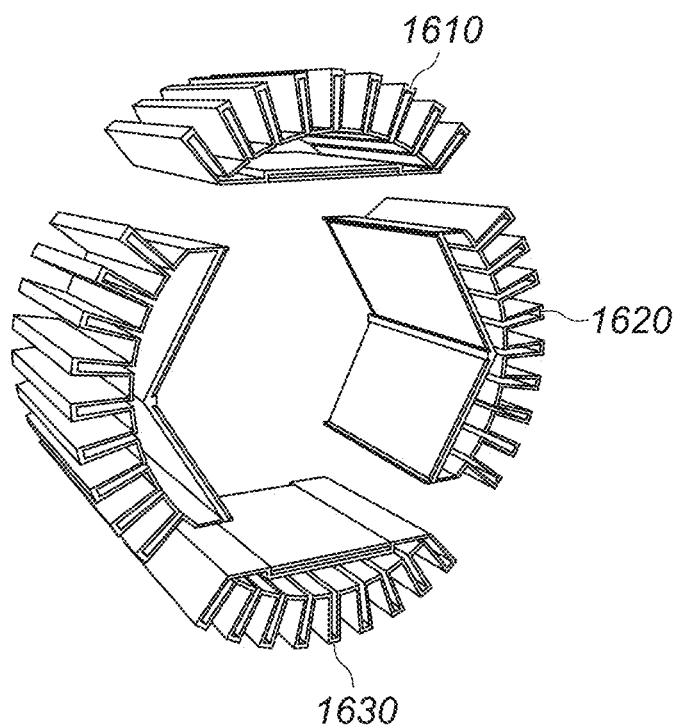
Figure 16C:
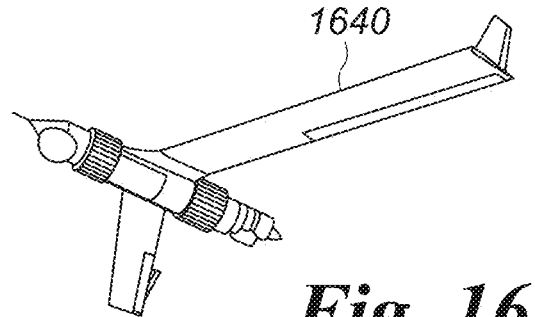
Figure 16B:
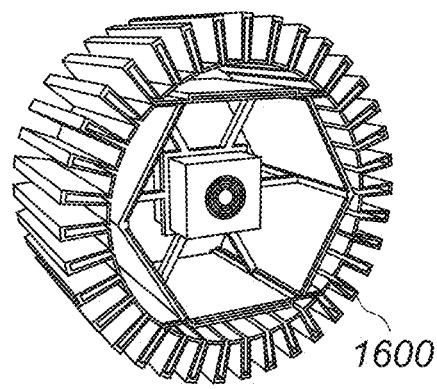
Figure 17A:
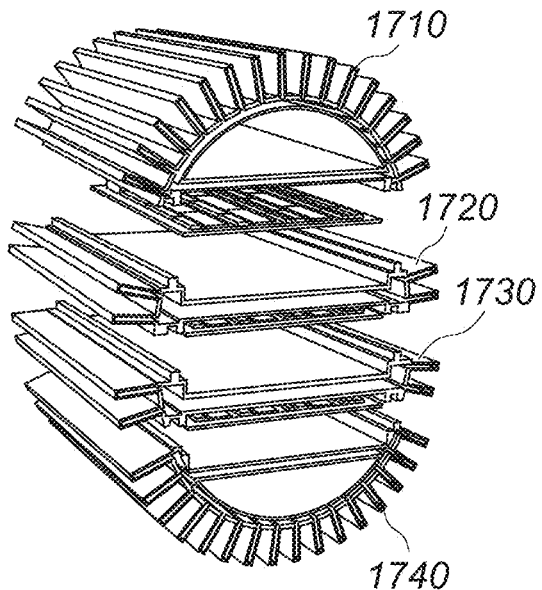
Figure 17B:
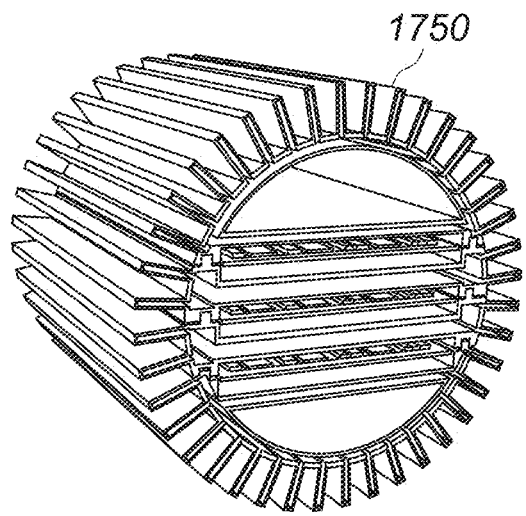
Figure 17C:
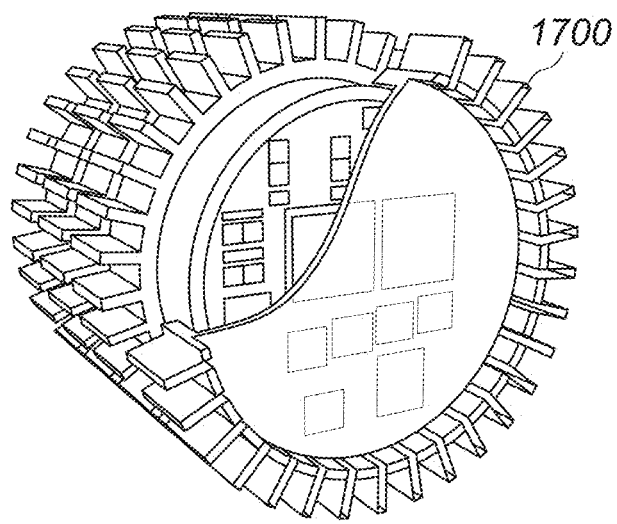
Figure 18:
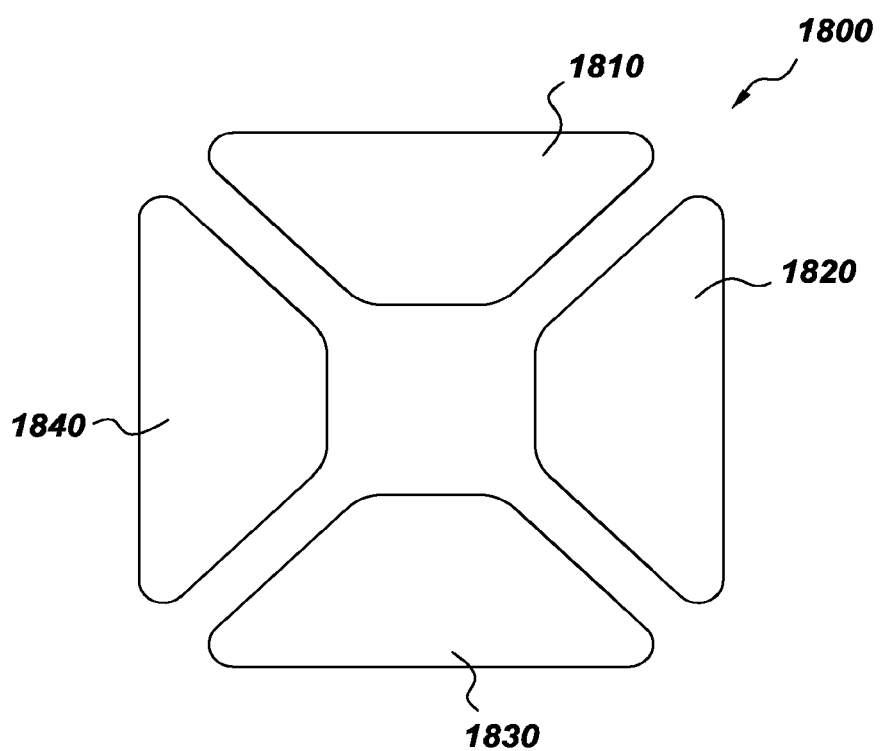
Figure 19A:
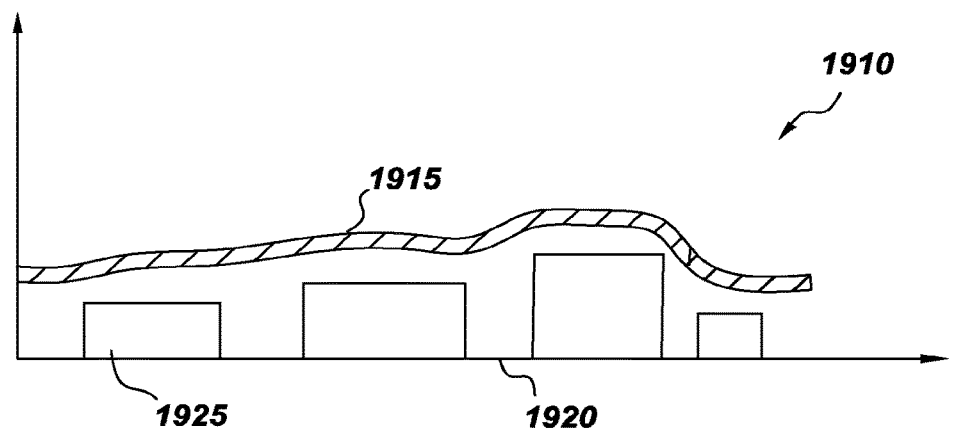
Figure 19B:
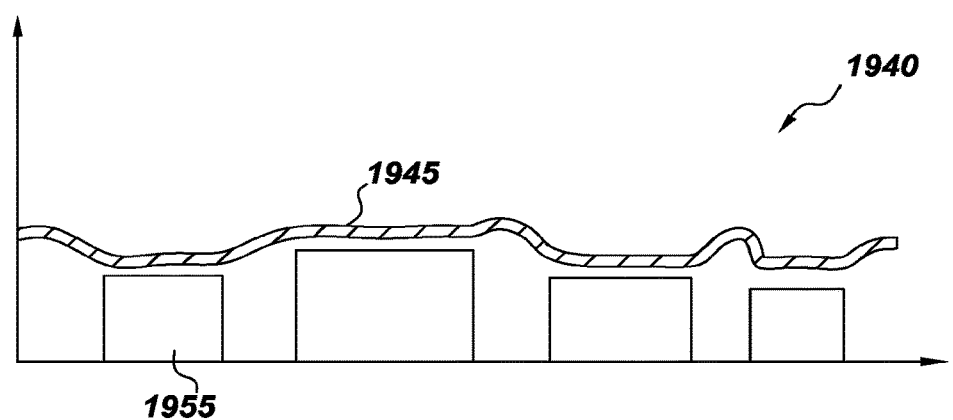
Figure 19C:
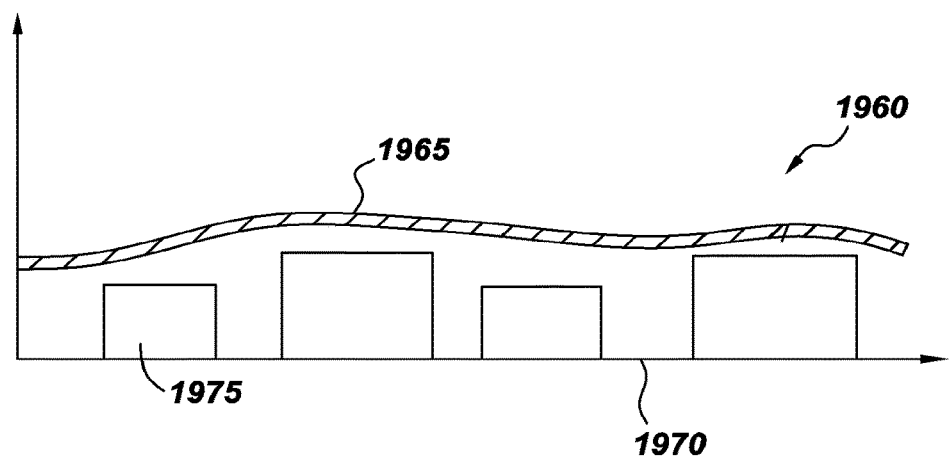
Figure 20:
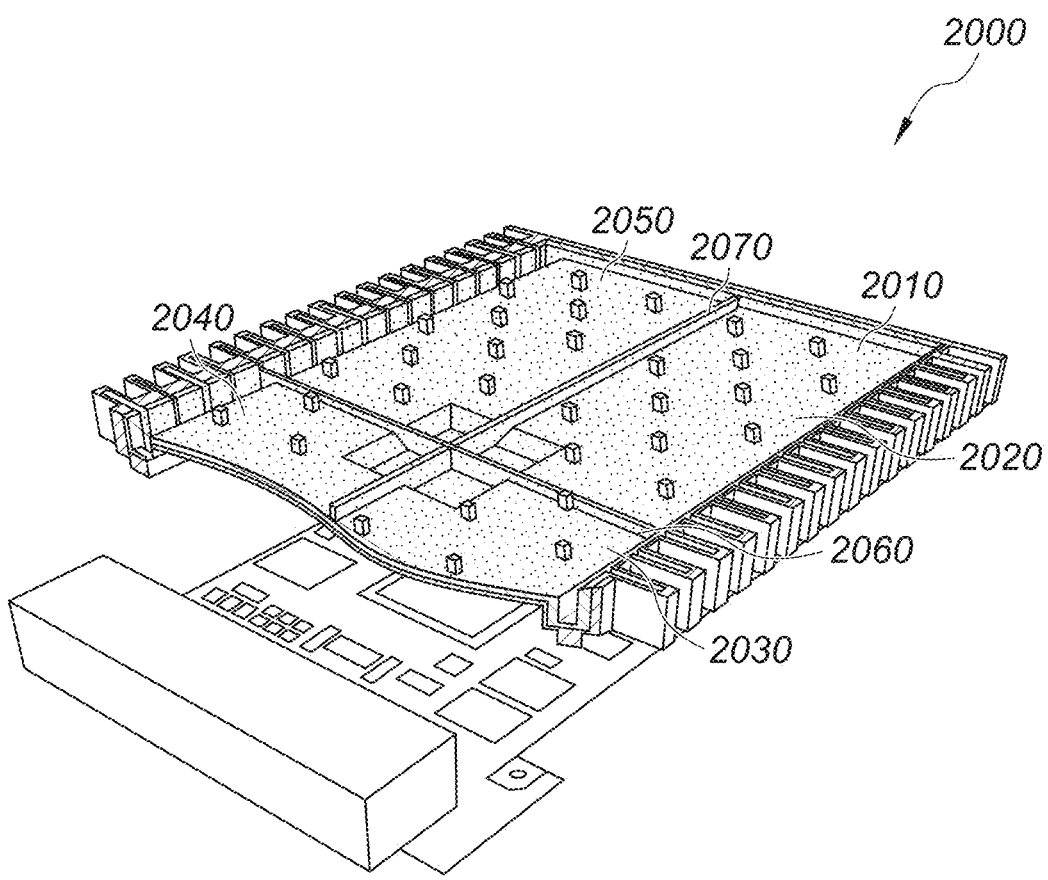

FIG. 11A-D depicts several examples of the non-uniform wick structure;

FIG. 12A-12B show modular vapor chamber embodiments with integrated hollow fins;

FIG. 13 shows thermal management system as a vertical assembly including several vapor chambers assemblies vertically assembled to form the chassis portion;

FIG. 14A-D shows stacked modular vapor chambers and assembly into avionics system with I/O module;

FIG. 15 shows embodiment with enhanced convection using synthetic jets located in bottom tray and on top of I/O module;

FIG. 16A-C shows modular vapor chamber in another embodiment that is integrated into the airframe skin;

FIG. 17A-C shows modular vapor chambers in alternate stacking configurations;

FIG. 18 shows a thermal management system as a planar assembly including two or more of the vapor chambers planarly assembled to form the chassis portion;

FIG. 19A-C shows various surface geometry of the 3D vapor chamber to envelop the circuit electronics including conformal, reverse-conformal and custom-conformal configurations;

FIG. 20 shows a thermal management system with a compartmentalized vapor chamber including several compartments partitioned within the same vapor chamber and adjacent to each other; and FIG. 21A-F is another example of the modular vapor chamber with complaint wall and wick structures.

DETAILED DESCRIPTION

Example embodiments are described below in detail with reference to the accompanying drawings, where the same reference numerals denote the same parts throughout the drawings. Some of these embodiments may address the above and other needs.

The thermal management system in one example describes a thermal management device comprising a sealed vessel that contains a working fluid. A specially engineered internal structure within the sealed vessel interacts with the working fluid to enhance the transfer of heat energy. The vessel is of a conformal, reverse-conformal or custom-conformal shape as required by the specific application. One part of the internal structure includes fine structures engineered to provide strong capillary forces to the working fluid at locations where they are required. Other parts of the internal structure include fine structures engineered to transport the working fluid with minimal pressure drop while preventing interference with the vapor state of the working fluid. Additional support structures, as part of the internal structure act to internally support and strengthen the sealed vessel, and thereby to provide additional paths for fluid transport. Working components, usually electronic, that generate parasitic heat losses are thermally connected to the thermal management system. In effect, the thermal management system establishes a specially engineered thermal path between the electronic components and a cold reservoir and thereby transfers the heat from the components to the cold reservoir.

Figure 1A:
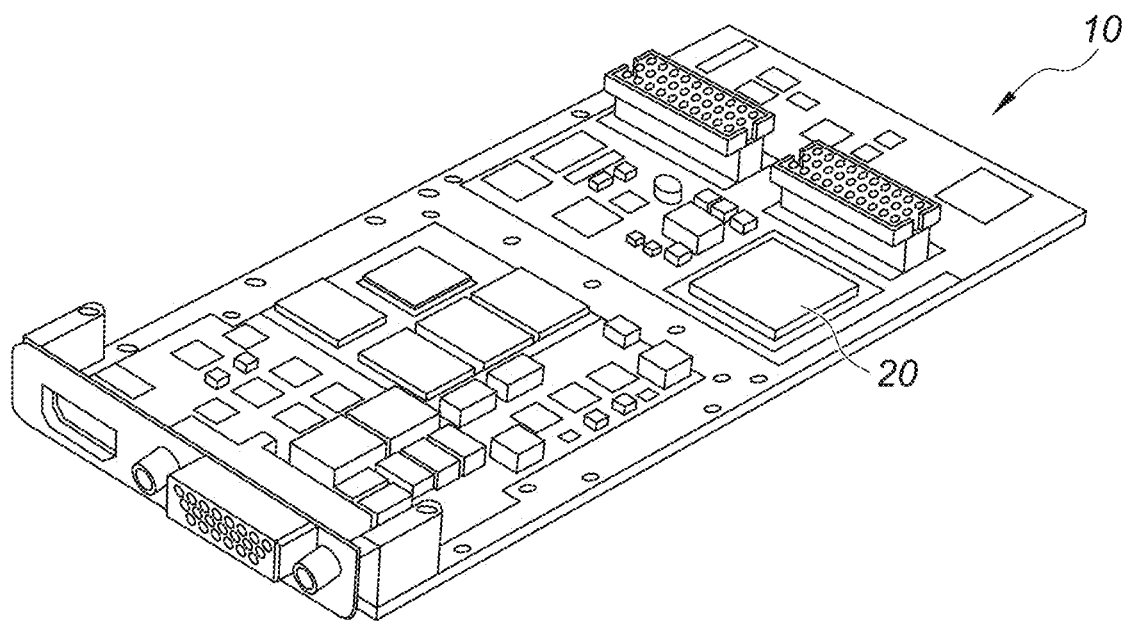
FIG. 1A and FIG. 1B shows a conventional circuit card assembly with electronic components on a circuit card mated to a heat frame.
Figure 1B:
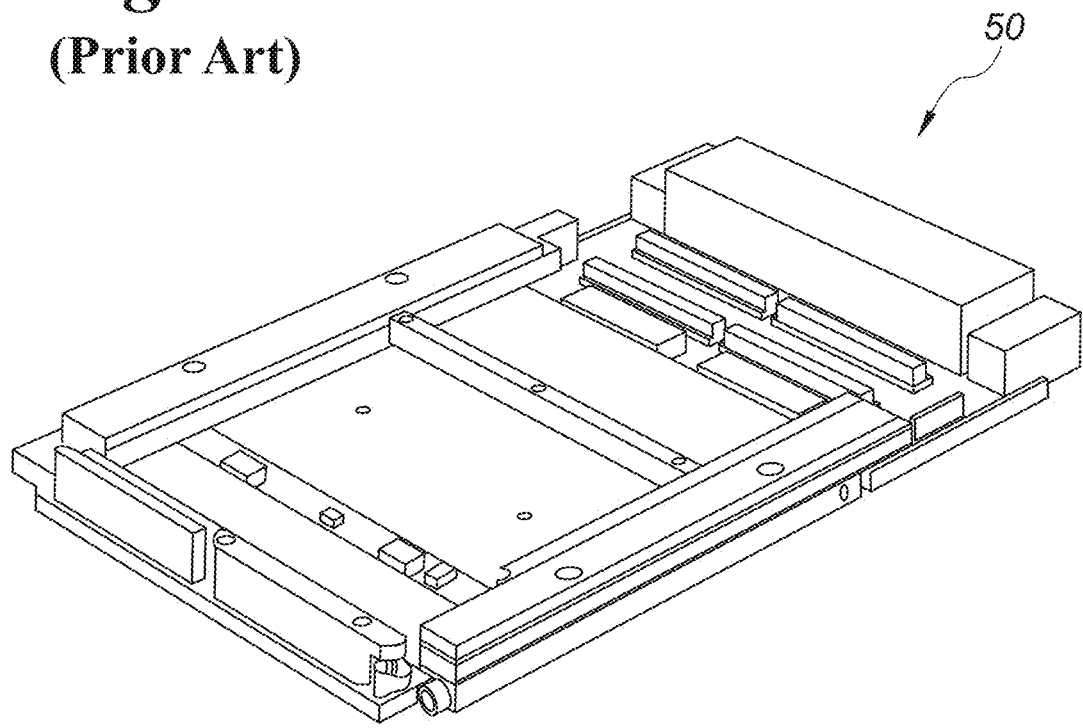

FIG. 1A and FIG. 1B shows a conventional circuit card assembly with electronic components on a circuit card mated to a heat frame. Referring to FIGS. 1A and 1B, a conventional circuit card 10 is shown in FIG. 1A with electronic components 20 that can include components such as processors that generate considerable heat. Referring to FIG. 1B, in many applications the circuit card 10 is coupled to a heat spreader card 50 by flipping the circuit card 10 and securing it to the heat spreader 50 so the components 20 are proximate the heat spreader 50. While this form of heat dissipation works to some degree, it can only dissipate a certain amount of heat generated by the components 20 and requires a large and bulky heat spreader 50. As the processing capabilities have increased, the individual components have decreased in size and require even greater heat dissipation capabilities in a smaller space.

Figure 2:
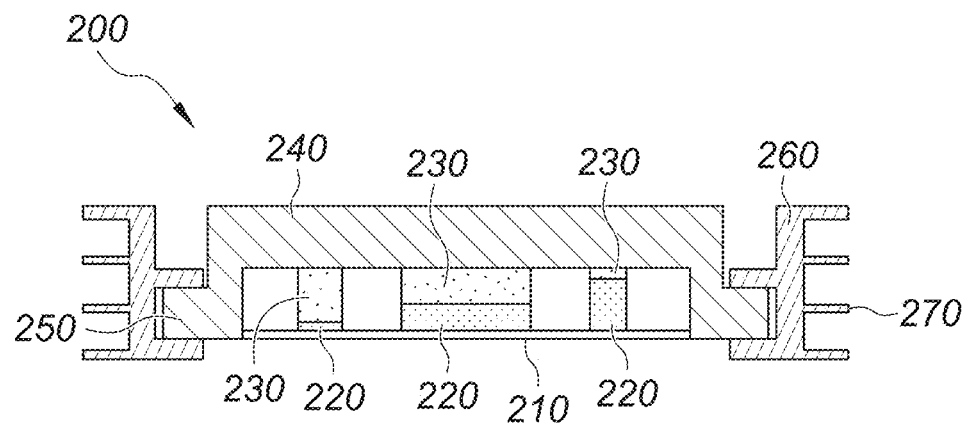
FIG. 2 is depicts the conventional circuit card assembly including the electronic circuit card, heat spreader, wedge-lock, chassis and fins.

FIG. 2 depicts a conventional thermal management system 200 according to one example for an assembly (not shown). In such a conventional system, the components such as the heat frame or heat spreader 240 with wedgelock 250 and circuit card 210 coupled thereto are mated to the chassis frame 260 having fins 270. In the state of the art, electronic components 220 are mounted to a component board 210 such as a printed circuit card/board (PCB). The components 220 typically have a thermal interface material (TIM) 230 to transfer the heat from the components 220 to the heatframe 240, particularly since the components 220 may have different shape/size and the heatframe 240 is configured to allow for the highest component height. The heatframe 240 is typically constructed of a material such as aluminum to provide for efficient heat transfer of has a sufficient size to facilitate the heat transfer.

As noted in FIG. 2, components 220 generate heat that is conducted through TIM 230 to the heatframe 240. The heatframe 240 further spreads the heat to the wedgelock 250, to the chassis frame 260 and then to the fins 270. Thus, the heat is finally dissipated to the environment and fins 270 are designed to be large enough to dissipate the expected heat from the electronic components.

In some cases, the heatframe 240 can be quite large in comparison to the circuit card 210. The wedgelock 250 is used to seat the heatframe 240 (pre-assembled with the card 210) into the chassis frame 260 wherein the chassis frame 260 has a mating portion for the wedgelock 250, for example a chassis groove, to receive the wedgelock 250. The wedgelock 250, in certain examples, is a cam operated device that serves to lock the heatframe 240 to the chassis frame 260. Chassis frame 260 typically has fins 270 to allow for a greater surface area so the external environment that can include cooling air or liquid that removes the heat.

Figure 3:
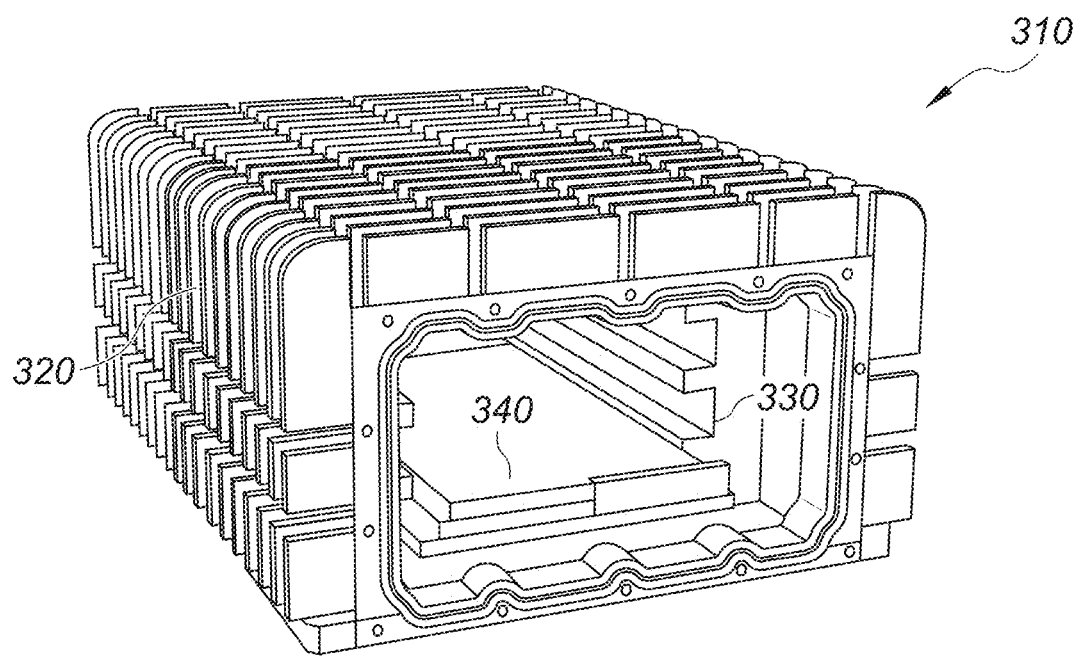
FIG. 3 shows a conventional chassis for housing circuit card assemblies.

FIG. 3 shows a conventional chassis for housing circuit card assemblies. Referring to FIG. 3, a chassis frame 310 is shown having a number of chassis grooves 330 for seating a number of circuit cards 340 with the heat spreaders and electronics. The chassis frame 310 has a network of chassis fins 320 about the perimeter of the chassis frame to provide for heat transfer, which is typically on three sides, such as right, left, and top. When there are multiple cards in the chassis frame, there may be considerable heat generated by the individual cards such that other heat transfer features such as heatpipes and vapor chambers may be utilized. In this example, the electronic circuit card is coupled to the heat spreader card which is then inserted into the chassis frame via the grooves using the wedgelock to secure the card assembly to the chassis frame.

Figure 4:
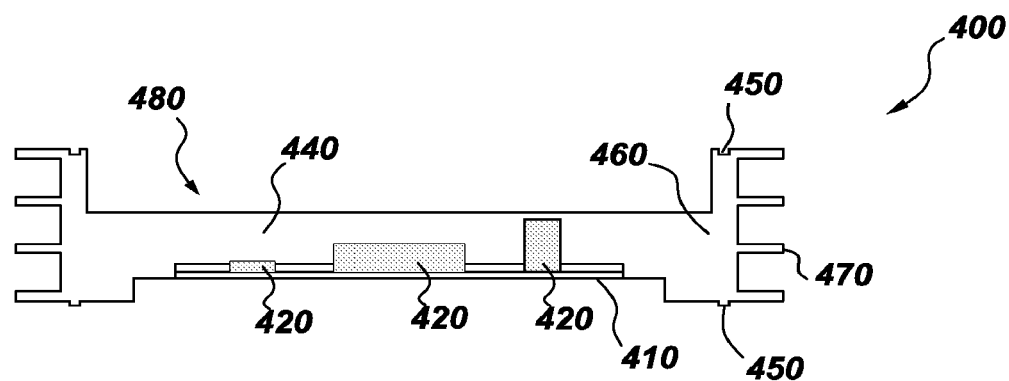
FIG. 4 illustrates one embodiment of the present system that includes an integrated assembly providing thermal management for an electronic circuit card.

FIG. 4 illustrates one embodiment of the present system that includes an integrated thermal management system for an electronic circuit card, wherein the integrated system is manufactured by additive manufacturing. As used herein, additive manufacturing refers to processing techniques such as 3D printing, rapid prototyping (RP), direct digital manufacturing (DDM), selective laser melting (SLM), electron beam melting (EBM), and direct metal laser melting (DMLM).

Referring again to FIG. 4, the integrated thermal management card assembly 400 in this example includes a heatframe 440, fins 470, card mounting portion 460 and chassis mounting portion 450 that are integrally formed as a unitary thermal management structure 480. In this example, the card mounting portion 460 integrally formed with the heatframe 440 removes the need for the wedgelock mating of the conventional assembly of FIG. 2. The card mounting portion 460 retains the printed circuit card 410 such as by friction fit and/or tongue and groove. The chassis mounting portion 450 is employed as part of the chassis architecture that is also used to seat circuit cards inserted in slots or channels. As part of ruggedizing this architecture, the mounting portion 450 ensures a friction fit in the chassis, so that the circuit cards do not shake loose from the backplane. It also provides pressure between the bottom of the card or heat frame and the chassis wall, thus creating a good thermal bond. In the depicted chassis architecture, the traditional wedgelock is superfluous as the elements are integrally formed and do not insert cards in slots, but stacks circuit cards as slices that are then retained to the I/O module via fasteners, thereby eliminating the traditional wedgelock.

In one example the heatframe 440 is a vapor chamber and the printed circuit card 410 with the accompanying components 420 are coupled to the vapor chamber. The printed circuit card 410 engages the heatframe 440 that is configured to receive the printed circuit card 410. In one example, the heatframe 440 includes a tongue and groove feature that follows the sides of the circuit card 410. The heatframe 440, in one example, is designed for the printed circuit card 410 and the accompanying heat generating component 420 such that the heatframe 440 is designed to be in close proximity to the components 420 on at least one side. In such an example, the thermal interface material is not required or can be minimized.

According to one embodiment, a further feature of the vapor chamber implementation is a reduction in the Electromagnetic Interference (EMI) of the assembly 480 which allows mating multiple assemblies while providing strong attenuation for EMI generated by the electronics or present in the external environment.

In addition, the heatframe 440 in one example is designed to be in close proximity for conductive coupling with not only the upper surface or top of the component 420 but in some examples on one or more sides of the component 420. The ability to effectuate heat transfer over a greater surface area of the components 420 greatly enhances the thermal management capabilities of the structure 480. In one example the heatframe 440 is conductively coupled to the top surface and at least one side surface of the component 420. As used herein, conductively coupled refers to being in direct, indirect or close proximity to a component such that heat transfer can occur. For the indirect contact, a material such as a thermal interface material can be utilized.

Thermal performance estimates using thermal resistance of the exemplary thermal management systems illustrated in FIGS. 4 and 6-18 with the 3D manufactured vapor chambers indicate they are superior to today's state of the art systems.

Figure 5:
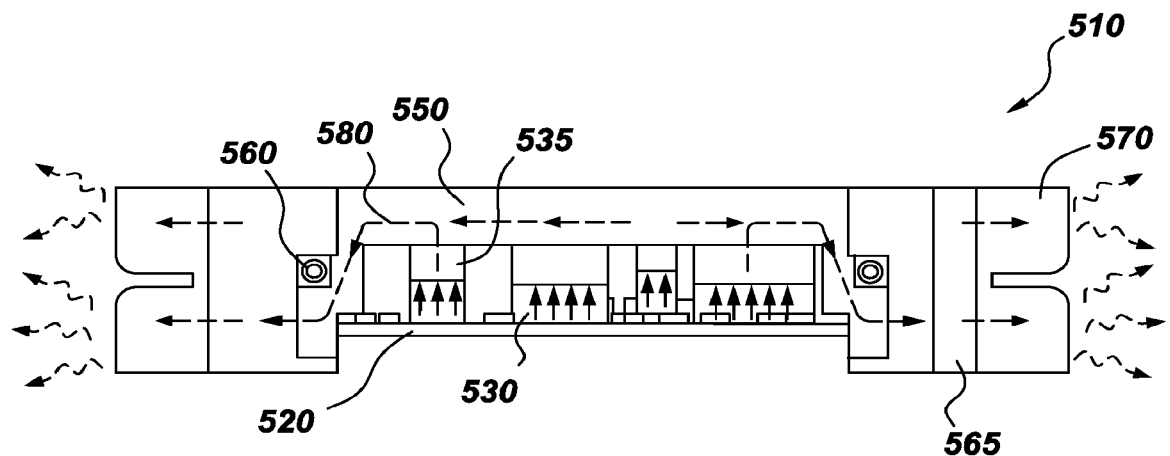
FIG. 5 shows the thermal flow path in a conventional chassis with attached circuit card assembly.

FIG. 5 shows the thermal flow path in a conventional chassis unit with attached circuit card assembly. Specifically, FIG. 5 is a cut away side perspective and depicts a conventional chassis unit 510 for a circuit card 520 having components 530 of varying size and shape and is secured to the chassis frame 565 by a wedgelock 560. The thermal flow path in a conventional chassis unit 510 comprising thermal interface material (TIM) 535, heatframe 550, wedgelocks 560 and chassis 565 with attached circuit card assembly. TIM 535 is typically used to conduct heat from the components 530 to the heat frame 550. At least some of the heat is conveyed by conduction 580 through the heat frame 550 to the chassis frame 565 and finally to the heat fins 570 and dissipated to the environment. The wedgelock 560 typically provides a mechanical camming mechanism that provides mechanical pressure forcing the heat frame 550 into intimate contact with at least one side of the groove in the chassis wall, ensuring mechanical retention of the heat frame 550 in the chassis unit 510 and acceptable thermal contact between the mating surfaces. The wedgelock 560 mechanism occupies space in the chassis wall and causes it to be thicker than it would otherwise be, increasing the size and weight of the overall chassis 510.

Figure 6A:
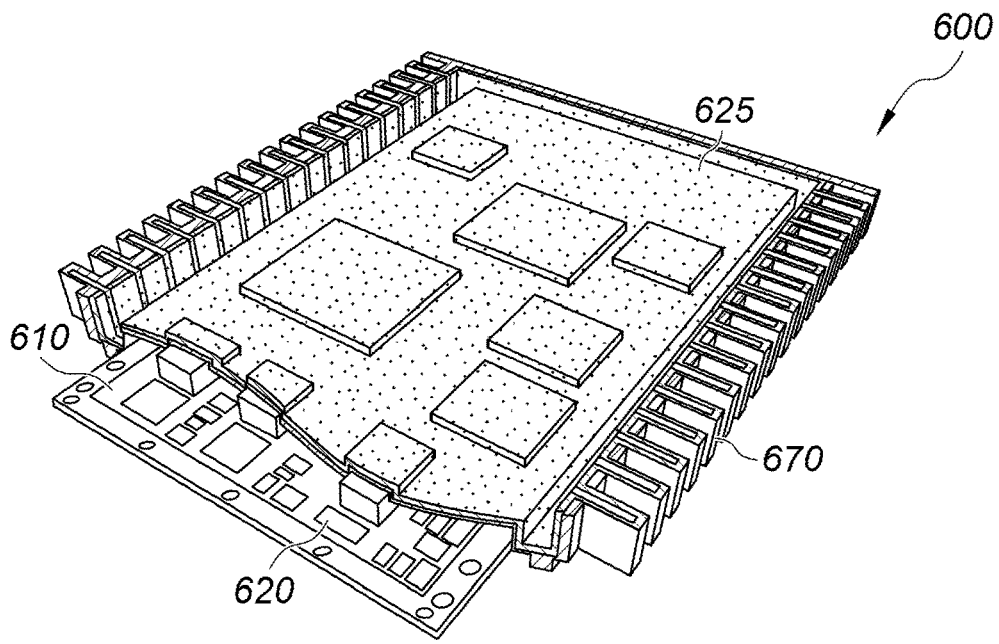
FIGS. 6A and 6B depict the modular vapor chamber according to one embodiment.
Figure 6B:
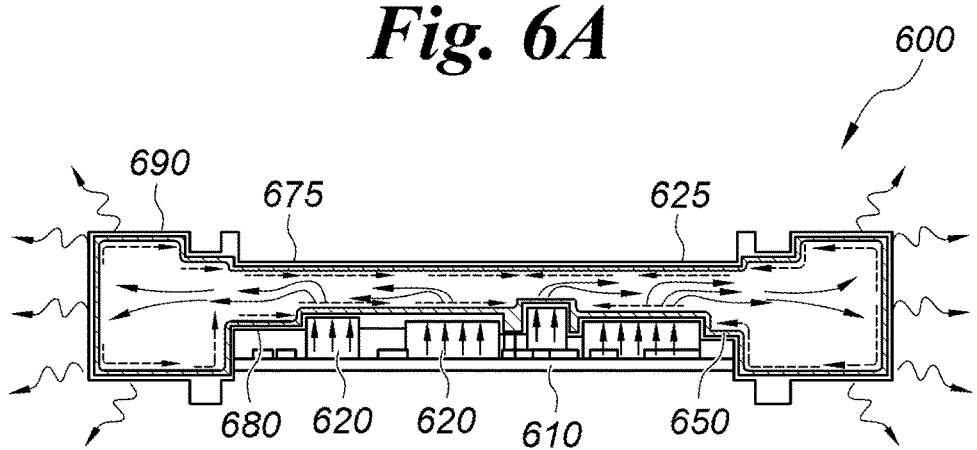

In FIGS. 6A and 6B, embodiments of the present system as a modular vapor system 600 are illustrated. The depiction in FIG. 6A shows a modular vapor chamber 600 that is custom designed to the circuit card 610 and having heat fins 670 to dissipate heat from the electronic components 620. The electronic components 620 reside on at least one surface of a circuit card 610 that engages the heatframe 625. The heatframe 625 in this example is designed to conform to the electronic components 620 to be in close proximity to the components 620 in order to efficiently remove heat from the components 620. The heatframe 625 is configured so the interior component side of the heatframe 625 is sized and shaped about the components 620 for optimal thermal transfer. In one example the circuit card 610 has components 620 on both sides and the heatframe 625 on both sides.

Referring to FIG. 6B, a three dimensional (3D) vapor channel chamber 600 for a circuit card 610 is depicted in a cut away side perspective view. The modular vapor chamber 600 has a component side 680 that in this example is custom designed to conform to the heat generating components 620 and optimize heat transfer by being in close proximity to the components. In one example the component side 680 is configured to conduct heat from at least one surface of the components 620, in particular those that generate the most heat. In another example, the component side 680 is configured to conduct heat from more than one surface of the components 620 such as the component top surface and one or more side surfaces. In one embodiment, coupled to the component side 680 is a wick structure 650 that helps to direct liquid towards the heated components 620 such as from the receptacle 690 located near the sides. The liquid is converted to vapor by the heated components 620, wherein the vapor absorbs the heat and moves outwards towards the receptacles 690 where the vapor is converted back into liquid. The receptacles 690 provide for further heat transfer such that heat from the vapor is removed and turns into liquid.

In one example the modular vapor assembly 600 is integrally formed with the wick structure 650, the component side 680 and the upper side 675 with the vapor chamber formed therebetween and having receptacles 690 on both sides. The distance between the component side 680 and the opposing upper side 675 of the heatframe 625 is typically at least 0.5 mm and can be further optimized for the required heat transfer to allow for the liquid to move along the wick surface from the receptacles 690 and for the vapor to return to the receptacles 690. In this example there are no internal supports. The integral structure includes the mounting features to mate with the circuit card 610.

Figure 7:
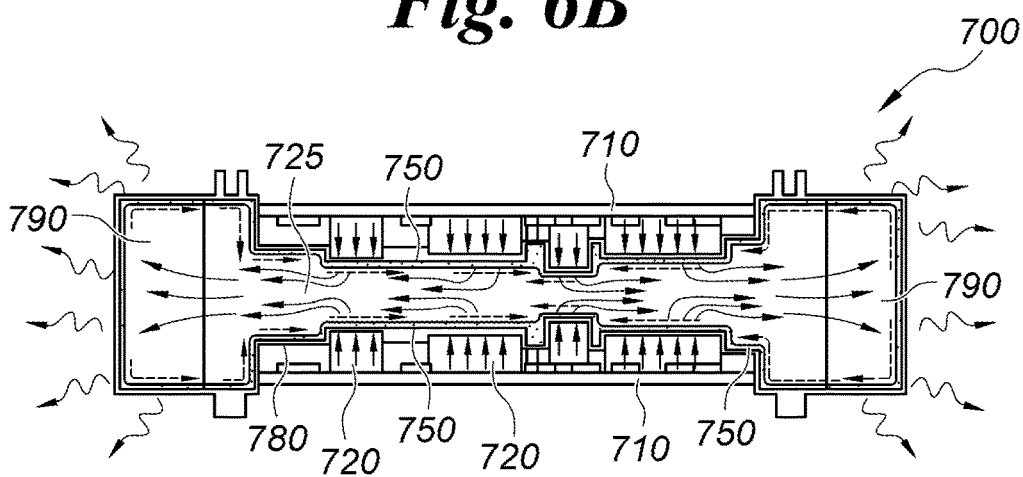
FIG. 7 shows another embodiment of the modular vapor chamber with two circuit cards.

Referring to FIG. 7, a cut away side view perspective shows one embodiment of the present system 700 that includes an integral three dimensional (3D) vapor chamber assembly 725 disposed between two circuit cards 710. The two circuit cards 710 each include a number of components 720, wherein the cards can be identical cards having the same components or different components and layout. The vapor chamber assembly 725 includes two component side surfaces 780 with wick structures 750 that form a vapor channel therebetween. In one example the modular vapor assembly 725 is integrally formed with the wick structure 750 and the vapor chamber 725 formed between the two circuit cards 710 have receptacles 790 on both sides. In this example there are no internal supports. Further, the integral structure includes the mounting features to mate with the circuit cards 710.

Figure 8:
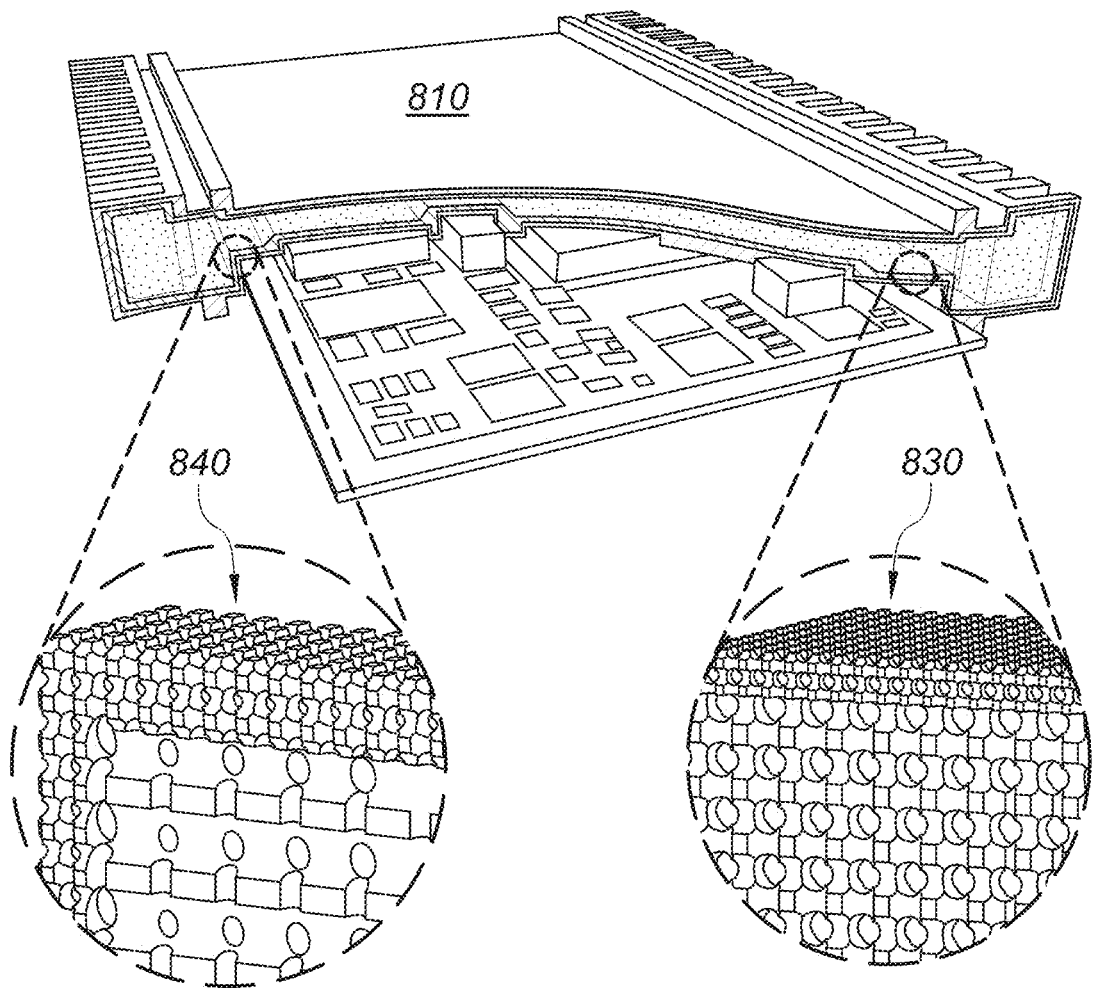
FIG. 8 is another example of the modular vapor chamber and various non-uniform wick structures.

FIG. 8 is an example of a thin modular vapor chamber 810 with various non-uniform wick structures. In FIG. 8 the vapor chamber assembly in this embodiment illustrates a thin vapor chamber 810 with the wick structures 830 and/or 840 formed on the component side of the vapor chamber. In one example the wick is a non-uniform wick in a thickness direction 830. In a further example the wick is a non-uniform wick in the thickness and planar directions 840. As used herein, the "thickness" refers to dimensions normal to local vapor chamber casing and "planar" refers to dimensions parallel to local vapor chamber casing.

Figure 9A:
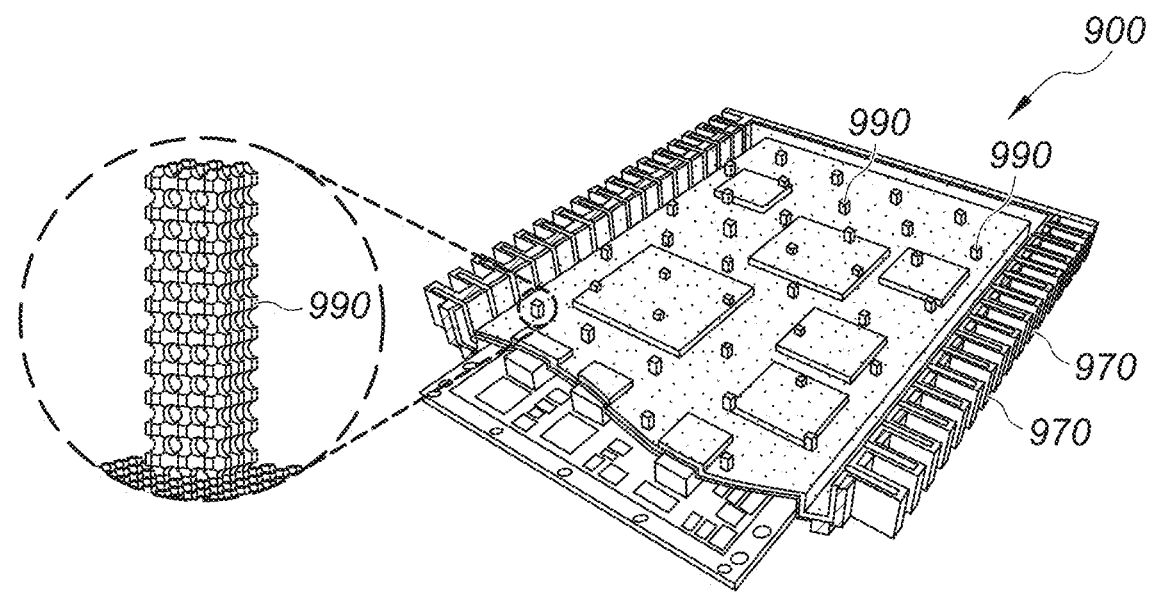
FIG. 9A shows another example of the modular vapor chamber having internal supports in accordance with another embodiment.
Figure 9B:
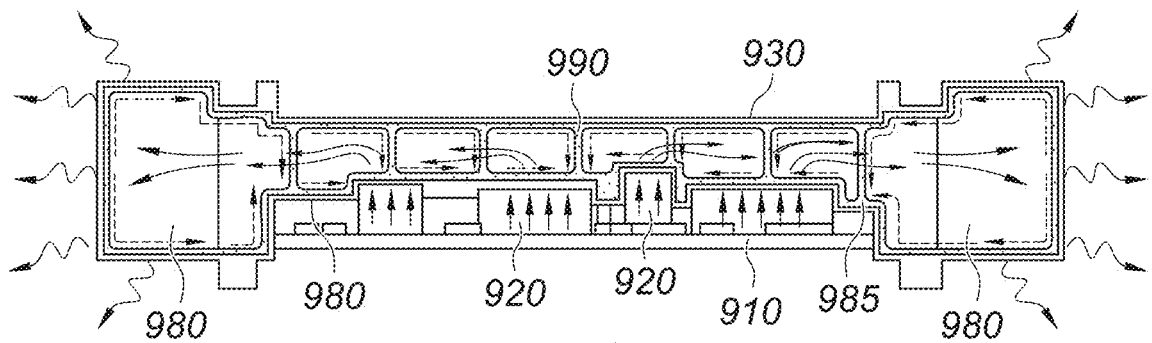
FIG. 9B shows a modular vapor chamber embodiment with wick structures for enhanced support and fluid flow.

FIG. 9A shows another example of the modular vapor chamber having internal supports. FIG. 9B shows the modular vapor chamber embodiment with off-plane wick structures for enhanced support and fluid flow. Referring to FIGS. 9A and 9B, the modular vapor assembly 900 is depicted showing internal supports or posts 990 that can be used to enhance stiffness and increase the liquid return. In this example, the modular vapor assembly 900 includes the modular vapor chamber 930 with one or more posts 990 that add greater stiffness to the assembly. A further aspect of the supports 990 is to increase the liquid transport by means or capillary action. The circuit card 910 includes electronic components 920 that generate heat that is conveyed to the vapor chamber 930 due to the close proximity to at least one side of the vapor chamber 930. The heat from the component 920 converts the liquid in the vapor chamber 930 to vapor that is then conveyed to the receptacles 980 and converted to liquid. Accordingly, heat from the components 920 is transferred to cold reservoir 982. The liquid is transported by the wick structure 985 that is formed on the component side of the vapor chamber 930. The posts 990 in this example are integrally formed wick structures that provide further capability to transport the liquid.

Figure 9C:
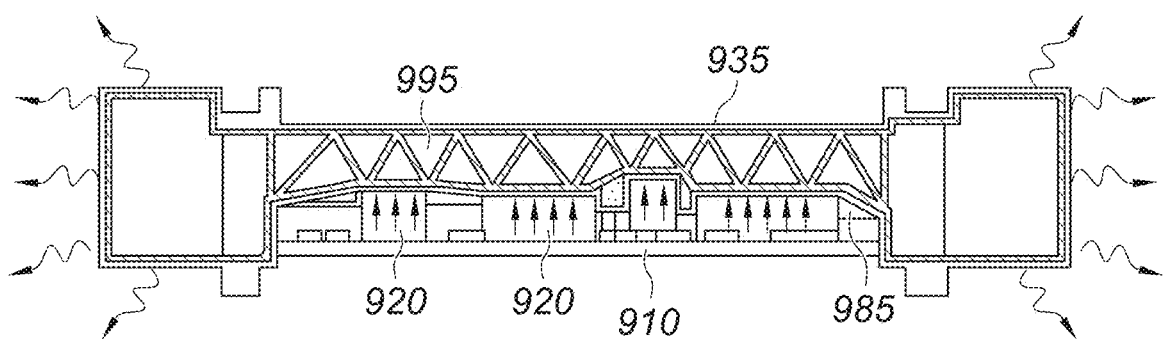
FIG. 9C shows a modular vapor chamber embodiment with internal support structures that may also serve as feeder arteries for the liquid.

FIG. 9C shows another embodiment of the modular vapor chamber embodiment 935 with internal support structures 995 that may also serve as feeder arteries for the working liquid. The components 920 generate heat that is transferred to the vapor chamber 935 which causes evaporation of the liquid in the wick structures 985 and converts the liquid to vapor that travels above the wick structures 985 to the receptacles. The internal support structures 995 in one example resemble bridge trusses or other bio-inspired structures for the vapor chamber case for high strength and low weight. Typically, the thickness of the vapor chamber case is 100-150 microns. However, using support structures such as 995, the vapor chamber case and the wick features can be made thinner, especially in proximity of the hot components and enhanced fins to decrease the thermal resistance. The wick structure and the support structures in one example are integrally formed by 3D printing or other additive manufacturing processes.

Figure 10A:
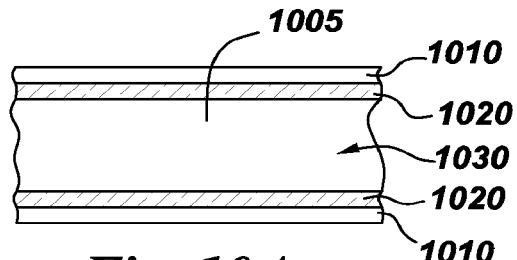
FIG. 10A-10G depicts various embodiments of the structural characteristics for the internal supports for the 3D vapor chamber.

FIG. 10A-10G depicts various embodiments and structural characteristics for the internal supports for the 3D vapor chambers described herein. The internal supports are used, for example, to maintain the shape of the vapor chamber and the dimensions for the vapor and liquid transport. While certain embodiments shown herein depict the vapor chamber having a wick structure on only one side of the vapor chamber, FIG. 10A shows the vapor chamber 1005 has two component sides 1010 and two porous wick portions 1020 that are on opposing sides and with a vapor space 1030 therebetween. Such an embodiment would be used when there are circuit cards with components (not shown) coupled on either side and conductively coupled to the vapor chamber component sides 1010 and with the vapor space 1030 disposed therebetween.

The vapor chamber in a further embodiment includes internal supports that are fabricated via the 3D printing process in numerous designs, number, shapes and sizes such as shown in FIG. 10B-10G. In one example, the supports comprise one or more solid internal support structures with braces 1045 that can be perpendicular within the vapor chamber case or angled. Another example includes having solid internal support structures 1055 that are curved or have a curved portion. In other embodiments, the internal supports 1065, 1075 include liquid feeder arteries to facilitate the liquid transport. For example, the internal supports can be porous structures that can be straight 1065 or curved 1075. Operationally, the supports should be designed such that the vapor chambers can withstand atmospheric pressure at any point of time. Specifically, the vapor chambers should neither break down under high atmospheric pressure nor implode under low atmospheric pressure. Further, the supports should be designed such that the vapor chambers do not affect the overall desired stiffness or rigidity of the chassis assembly.

Figure 10B:
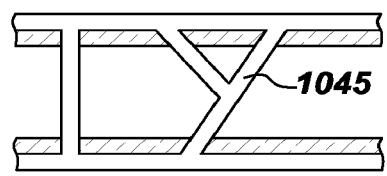
Figure 10C:
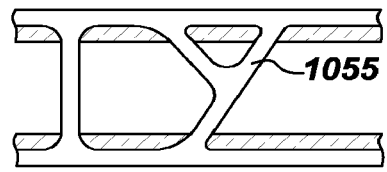
Figure 10D:
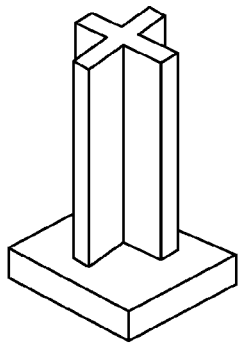
Figure 10E:
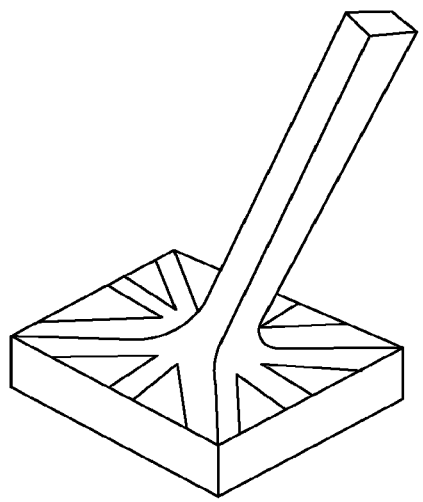

Various shapes for solid internal supports are shown in FIG. 10B-10D. Referring to FIG. 10B, the internal support and brace 1045 are straight structures that are internally coupled between the opposite surfaces of the vapor chamber 1040. In FIG. 10C, the solid internal support structures are angled or curved 1055. FIG. 10D shows an internal support structure 1050 without the brace. The internal support in one example is positioned proximate the heated component(s), sometimes referred to as the pocket. In another example shown in FIG. 10 E, the solid internal support structure includes a vascular or root system for efficient spreading of force/loads and/or liquid.

Figure 10F:
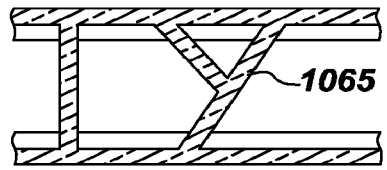
Figure 10G:
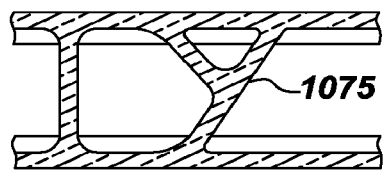

FIGS. 10F and 10G depict internal support and liquid feeder arteries. The support structures in these examples are porous and allow for liquid and/or air to pass through the structure within the vapor chamber. FIG. 10F shows straight porous internal support structures while FIG. 10G illustrates angled or curved internal support structures.

The number of the internal supports may be dependent upon the design criteria and factors include the required support for the vapor chamber case and the thermal properties of the various supports. The size and shape for the internal supports also depends upon the design criteria and thermal/mechanical requirements. Whenever the supports are desired only for lending structural strength to the vapor chamber, solid supports are used. On the other hand, when the supports are desired additionally for enhanced cooling of the electronic components, wick structure is used.

According to one embodiment, there are various wick structures that are employed with the vapor chamber assemblies. In one example the wick structures are formed from additive manufacturing processes such as 3D printing. The wick structures can be uniform or non-uniform wick structures in multiple directions. According to one embodiment, the wick structures are deployed within the internal space of the vapor chamber and also serve as internal support structures.

Figure 11A:
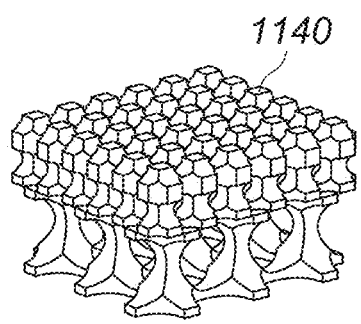
Figure 11B:
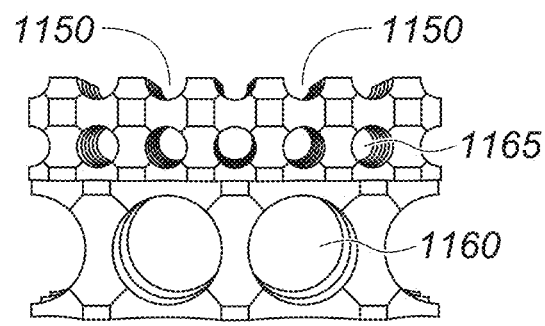

FIG. 11A-D depicts several examples of the non-uniform wick structure. Specifically, FIG. 11A shows a perspective view of a non-uniform wick structure 1140 in the thickness direction (z direction). In FIG. 11B, the non-uniform wick structure 1150 in the thickness direction shows the pores 1160, 1165 which in this example has larger size pores 1160 proximate the component side of the vapor chamber for transporting liquid. The pores 1165 on the vapor side are of a smaller pore size and transport the vapor to receptacles in the vapor chamber. The pores in these examples are round or curved spaces, wherein the curved wick structure allows for 3D printing in any orientation that allows for non-planar vapor chambers.

Figure 11C:
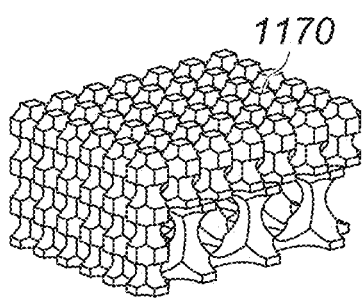
Figure 11D:
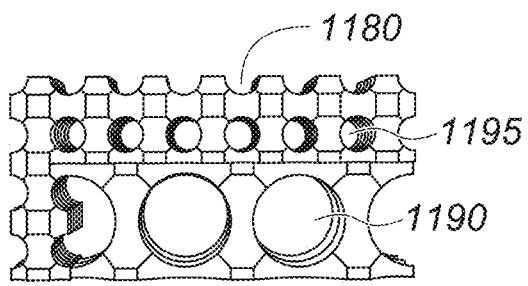

Referring to FIG. 11C, the non-uniform wick structure 1170 is shown in the thickness and in-plane direction (x-y direction). In FIG. 11D the non-uniform wick structure 1180 shows further examples of the larger pores 1190 on the liquid transport side and smaller pores 1195 on the vapor transport side.

The structures shown in FIG. 11A-11D are one example of a class of geometries by 3D printing in almost any orientation and straightforward transitions from larger to smaller pores and vice-versa. The one example shown is for circular cylindrical "bore-holes" along the three axes. It is to be noted that, apart from the cut planes, there are no straight surfaces in this pore-scale geometry. This attribute is used for build-orientation of independent non-uniform wick structures. The figures show non-uniform wick structures built on a planar surface, but a further embodiment provides for deforming these wick structures to follow a curved 3D surface that in one example has a large radius of curvature relative to the thickness of the wick structure layer. These representative wick structures 1140, 1150, 1170, 1180 that are 3D printed can be built in numerous orientations, unlike posts or braces, because it is built with curves or arc portions. For example, large overhangs cannot be effectively printed without support structures, and these wick structures allow for internal build supports that can be integrated with the inner surfaces, namely the vapor side and the casing side of the vapor chamber.

FIG. 12A-12B show modular vapor chamber embodiments with integrated hollow fins. As shown in FIGS. 12A and 12B, the modular vapor chamber 1210 is shown according to yet another example. In this example, the vapor chamber fins 1220 are hollow vapor chamber fins, thereby permitting a greater surface area for heat transport. The large condenser surface area associated with the fins 1220 dramatically decreases the contribution of the condensation thermal resistance (temperature drop) in the thermal resistance chain. In another embodiment, the hollow fins may be replaced by other heat exchange mechanisms such as an integral fluid heat exchanger or a cold plate interface coupled to the system.

FIG. 13 shows a thermal management system for electronics 1300 as a stacked assembly, including several vapor chambers assemblies 1330, 1340, and 1350 with or without circuit cards and assembled along with chassis case portions such as an upper and lower chassis mount to form the chassis 1300. Referring again to FIG. 13, the modular stacked assembly 1300 includes multiple modular vapor chamber assemblies 1310, 1330, 1340, and 1350, each configured to be stacked together to form the larger unit. In one example the circuit card assemblies 1320 are coupled to respective modular vapor chamber assemblies which are then combined into the chassis 1300. As previously described the circuit cards can be coupled to the vapor chamber assemblies such as by friction fit or other securing mechanisms. The modular vapor chamber assembly units 1330, 1340, and 1350 including any corresponding circuit cards 1320 are secured to each other by fastening mechanisms such as bolts. There can be any number of modular vapor chamber assemblies and circuit cards stacked together and secured as a unitary assembly. The outermost portions of the modular stacked assembly may or may not be coupled to circuit cards and may be used for packaging and securing the assemblies and circuit cards.

Figure 14A:
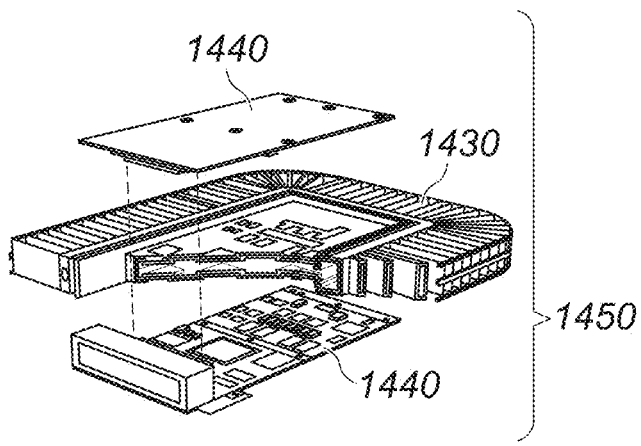
Figure 14B:
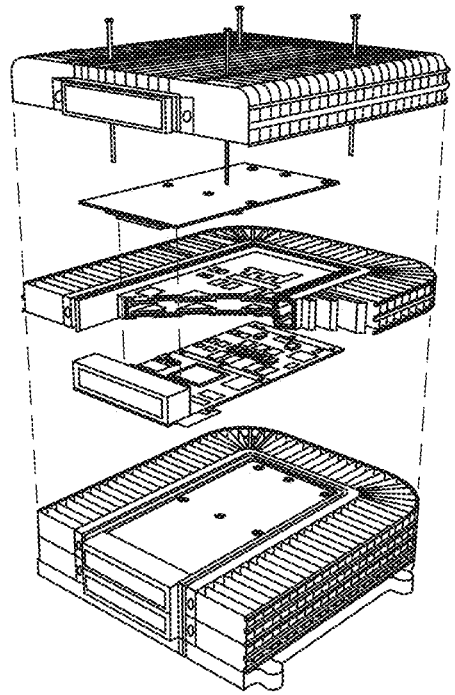
Figure 14C:
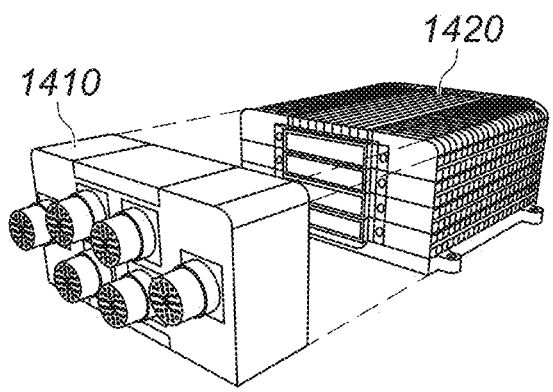
Figure 14D:
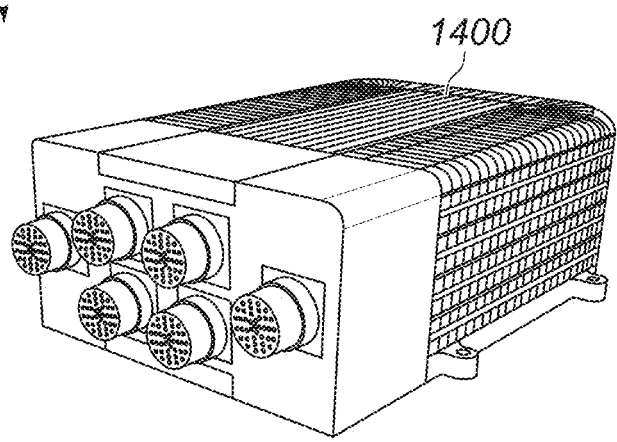

FIG. 14A-D shows an example of forming the stacked modular vapor chambers and corresponding circuit cards assembled into an avionics system 1400 with corresponding input output modules 1410. Referring to FIG. 14A, a further depiction of the stacked modular vapor chambers is illustrated with circuit cards 1440 coupled to both sides of a vapor chamber 1430 forming a vapor chamber sandwich 1450. The sandwich 1450 shows the vapor chamber 1430 disposed between the electronic circuit cards 1440. As shown in FIG. 14B, the modular vapor chamber sandwich 1450 can be stacked with other modular vapor chamber sandwich units and secured to each other to form a modular electronic assembly 1420. In FIG. 14C, the modular electronic assembly 1420 is electrically coupled to a backplane or input/output modules 1410, forming the final assembly 1400 as depicted in FIG. 14D.

As detailed herein, one of the unique attributes of the present system is a 3D vapor chamber having non-uniform wick structures. A further aspect is the collection of individual vapor chambers to form a modular chassis, wherein the circuit cards are aligned and the vapor chambers are stacked to reduce the EMI by isolating the individual vapor chambers.

Other features of the modular chassis stack relate to the mechanical architecture. For example, the ability to configure a chassis with a variable number of 'slots' depending on the application, the use of an integral base plate/air mover (such as synthetic jets or fan). A further aspect employs a separable I/O module that is customized to the application and environmental requirements.

For example, FIG. 15 shows an embodiment of the thermal management system for an electronic assembly 1500 with enhanced convection using synthetic jets 1550 located in at least one of the lower tray 1540 and upper tray 1530 of electronic assembly 1500. In this example the upper tray has fins and considerable access to the external environment for increased air flow. The synthetic jets 1550 are added to augment the airflow and enhance free convection. The I/O connectors 1510, 1520 in this example include cut-outs for external air flow such as from turbines or fans.

FIG. 16A-C shows a modular vapor chamber 1600 in another embodiment that is integrated into an airframe 1640. Referring to FIG. 16A, the individual vapor chambers 1610, 1620 and 1630 in the shapes and with structural supports for the intended application are shown along with the exterior heat fins. FIG. 16B illustrates the modular vapor chambers assembled into a circular unitary thermal management assembly 1600. FIG. 16C shows the thermal management assembly 1600 configured to enable various applications such as deployment in an unmanned aerial vehicle 1640.

FIG. 17A-C shows thermal management assemblies with different stacking configurations of the modular vapor chambers. Referring to FIG. 17A, there are several modular vapor chambers 1710, 1720, 1730 and 1740 with circuit cards coupled to the chambers that are shaped and sized to form the thermal management assembly 1750 of FIG. 17B. The circuit cards for the modular vapor chambers 1720, 1730 are stacked along the length of the thermal management assembly 1750 with exterior fins encircling the assembly 1750 for dissipating the heat. FIG. 17C shows a thermal management assembly 1700 with modular vapor chambers having circuit cards radially disposed in a circular form allowing for heat dissipation on all the exterior surfaces.

FIG. 18 shows a thermal management system 1800 as a planar assembly such as circular, square or rectangular, including two or more partitioned vapor chambers 1810, 1820, 1830 and 1840 planarly assembled to form the chassis of the system 1800. Referring again to FIG. 18, the assembled thermal management system 1800 has a heatframe that includes a number of partitioned modules/vapor chambers 1810, 1820, 1830 and 1840 from a planar perspective. In one example, a typical heatframe unit is replaced by several vapor chambers 1810, 1820, 1830 and 1840 arranged in a planar manner coupling the vapor chambers with respective circuit cards and assembled to provide thermal and structural support to the thermal management system 1800. In this configuration, even if one of the vapor chambers 1810, 1820, 1830 and 1840 is punctured, the other vapor chambers keep supporting and cooling the electronics. Such a system structure supports redundancy and critical mission initiatives.

FIG. 19A-C shows various surface geometries of the 3D vapor chamber to envelop circuit electronics including conformal, reverse-conformal and custom-conformal configurations. In one example, the distance or gap between the electronic components and the component side of the vapor chamber is 5-12 microns. In FIG. 19A, the thermal management structure 1910 is customized such that the component surface geometry of the 3D vapor chamber 1915 is approximately conformal to the circuit card 1920 and components 1925 in maintaining the vapor chamber in close proximity to the components 1925 for efficient heat transfer. In one example the component side of the vapor chamber provide conductive coupling on the top surface of the components and one or more sides of the components.

In FIG. 19B, the thermal management structure 1940 is customized such that the surface side of the 3D vapor chamber 1945 is reverse-conformal to the circuit card 1950 and components 1955 in keeping with design criteria for integration in the chassis with other cards. In such configurations, the vapor chamber case lifts down and reaches out to the electronic components 1955. This arrangement in certain applications aids in capillary transport of the liquids through the wick structures.

In one further example shown in FIG. 19C, the thermal management structure 1960 is customized such that the surface side of the 3D vapor chamber 1965 is custom-fit to the circuit card 1970 and components 1975 to increase the heat transfer and optimize the cross section coverage of the components 1975 by the vapor chamber 1965 and particularly the components that generate the most heat.

In each of these examples of the thermal management systems 1910, 1940 and 1960, the ability to customize the surface geometry of the 3D vapor chambers 1915, 1945 and 1965 to the circuit card components optimizes the thermal management and allows for higher density of components and components with greater temperatures. The circuit cards 1920, 1950 and 1970 and components 1925, 1955 and 1975 in one example have a standard layout such that multiple boards can be accommodated by a single heatframe design. In addition, the integral design of corresponding mounting features (not shown) into their respective heatframes (not shown) allows for improved mating with the boards 1920, 1950 and 1970, thereby eliminating the conventional wedgelock. Furthermore, the ability to integrally design the fins (not shown) and chassis (not shown) to the heatframes (not shown) allows for customization for the intended heat dissipation for specific circuit cards and components. A result of the thermal management structures 1910, 1940 and 1960 that allows for smaller heatframes when thermal characteristics are not high and for larger heatframes and fins for components that generate more heat. According to one example, the 3D vapor chambers 1915, 1945 and 1965 in the integral thermal management structures 1910, 1940 and 1960 are made using additive manufacturing technology such as 3D printing.

FIG. 20 shows an alternative configuration of the compartmentalization of the vapor chamber in a horizontal plane. Referring to FIG. 20, such a thermal management system 2000 includes a larger, compartmentalized vapor chamber 2010. The bigger vapor chamber 2010 is divided into several compartments 2020, 2030, 2040, 2050 and so on using partitions 2060, 2070 and so on. The compartments 2020, 2030, 2040, 2050 may be equal or unequal in size depending on the design purpose. Further, each of the compartments 2020, 2030, 2040, 2050 may be designed to serve/cool the specific electronics coupled to the respective vapor chambers. The compartmentalization of the vapor chambers allows at least some of the vapor chambers to function if one or more compartments are compromised. At the same time, the compartments 2020, 2030, 2040, 2050 share common boundary walls and are unified by the structural integrity and rigidity of the bigger vapor chamber 2010.

Figure 21E:
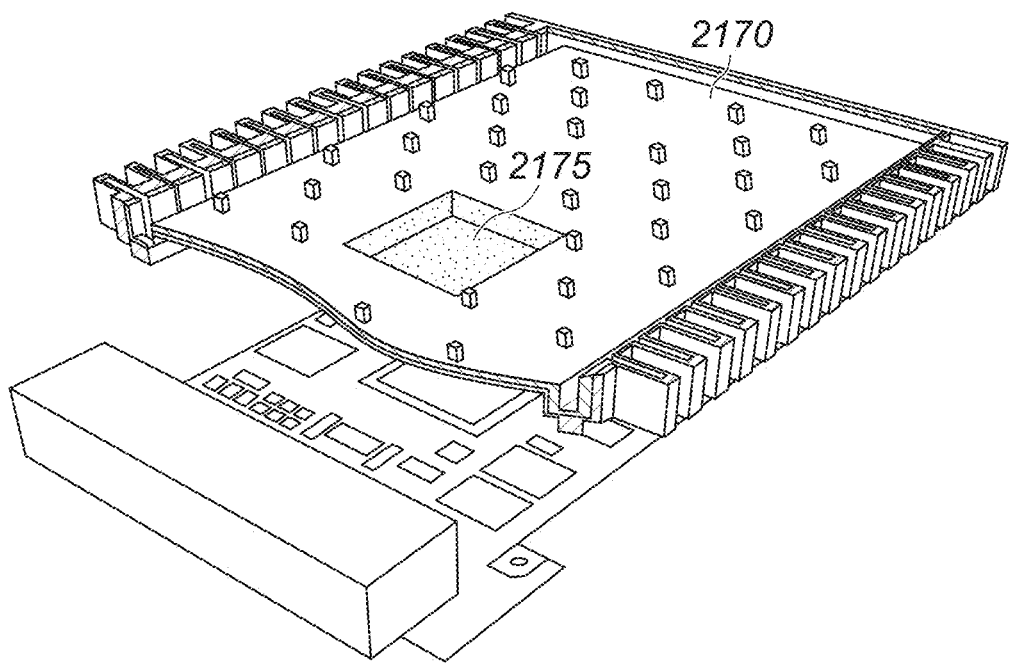
Figure 21F:
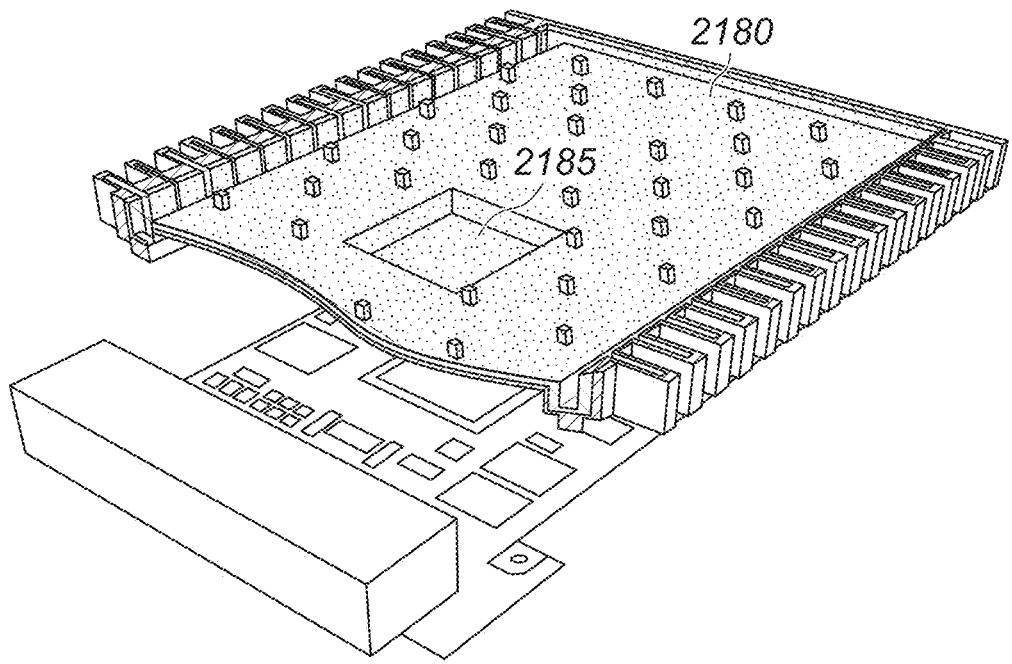

FIG. 21A-F are other examples of the modular vapor chamber with compliant wall and wick structures. Referring to FIG. 21A, the modular vapor chamber 2100 includes wall (vapor chamber case) 2110 and wick structures 2130 and 2140. As for the wall 2110, it conforms to the top of the electronic components represented by an angled rectangle 2120. The rectangle 2120 is typically angled/slanted because the electronic components are "tipped" relative to PCB due to manufacturing tolerances and thus may have a non-horizontal top-profile. Operationally, the vapor chamber case 2110 needs to adapt to the angled top-profile and at least that area of the vapor chamber case wall is made compliant. Exaggerated representation of ridges 2115 in the vapor chamber case 2110 enable the desired compliance without plastic deformation. In other examples, in addition to the wall 2110, the wick structures 2140 associated with the compliant part of the wall 2110 are also made compliant. Referring to FIG. 21A once more, 2130 refers to the plurality of wick structures that are rigid/non-compliant and 2140 to the plurality of wick structures that are compliant. By construction, the wick structures in area 2130 are typically connected to each other internally whereas the wick structures in area 2140 are unconnected. There are various ways these complaint parts of the vapor chamber case 2110 and the wick structures 2140 can be permuted and combined as described below.

FIG. 21B represents an example of the modular vapor chamber with wick structures 2140 having uniform pore size all through and the structure posts 2145 positioned at relatively uniform distance from each other. FIG. 21C represents an example of the modular vapor chamber with wick structures 2140 having small pores near the top, large pores near the vapor chamber case. In such a configuration, the structure posts 2155 are positioned such that there are relatively smaller gaps through the structures at the top and larger gaps at the bottom. FIG. 21D represents an example of the modular vapor chamber with wick structures 2140 having large pores near top and small pores near the vapor chamber case. In such a configuration, the structure posts 2165 are positioned such that there are relatively larger gaps through the structures at the top and smaller gaps at the bottom. Further, referring to FIG. 21E, in the vapor chamber case 2170, compliant and unconnected wick structures 2175 are localized only to the component area. Furthermore, referring to FIG. 21F, unconnected wick structures line the whole vapor chamber case 2180 including the unconnected wick structures 2185 making the whole vapor chamber case 2180 compliant.

In operation, according to one embodiment, the thermal management system includes a vapor chamber having a vapor chamber case with a component side and an opposing vapor side, internal wick structures disposed on at least the component side, internal working fluid, and additional internal support structures. The system in one example is made as a single unitary structure, wherein the case, wick structures, and internal support structures are integrally formed during formation by 3D printing or other Additive Manufacturing process. The working fluid is typically added to the internal structure until the wick is saturated, then the outer case is sealed. This filling process introduces the working fluid into the case. In certain examples, some of the fluid will be in the liquid state, while some may be in the vapor state. When one part of the thermal management system is thermally connected to a cold reservoir, and another part to a heat source such as electronic components, heat is conducted from the heat source, through adjacent vessel envelope wall, and into the adjacent wick structure which is saturated with liquid. This addition of heat causes the liquid phase of the working fluid to boil into the vapor phase within the vessel. The process is similar to that of an operating heat pipe.

In one embodiment, the wick structure is engineered such that very fine features are present near the heat source, thus increasing the strength of the capillary force. However, the fine structures have a high fluid resistance. Therefore, the wick structure between the cold reservoir and heat source is engineered as a coarse structure with smooth features that minimize the fluid resistance. The fine and coarse structures are engineered to maximize the rate of fluid transport, and thus the optimal amount of heat can be transferred.

In another embodiment, the wick structure between the cold reservoir and heat source includes finer structures close to the vapor gap, and coarser structures close to the vessel wall. The finer structures prevent the liquid phase of the working fluid passing through the wick from interacting with the vapor phase of the working fluid passing through the vapor space in the opposite direction. The coarser structures near the vessel wall allow the liquid to pass through the wick with minimal pressure drop. In one example, the thermal path from the electronic component to the cold reservoir is enhanced by transporting the working fluid (any mix of liquid and vapor) contained within the vapor chamber by means of capillary action through any combination of the wick structure and the internal support structure to dissipate heat from the heatframe.

The assembly in one example enhances the thermal capability and the entire structure is fabricated using additive manufacturing technology to allow for complex geometries that are conformal to the components. Although the figures indicate "pockets" for the hot components, in one exemplary embodiment the vapor chamber case "conforms" to the hot components via "pockets", "planes", or "posts", as needed. According to one example the wick structure is non-uniform wick oriented in the thickness direction. In another example the wick structure is a non-uniform wick having a thickness and planar directions.

In a thermal management system for circuit cards in a chassis, the components have parasitic heat losses that thermally coupled to the device. These losses are removed in order to maintain a proper operating environment for the electronics. In one example the present system moves the heat from the component such as to cold sink reservoirs, thus maintaining the component at low temperature.

The present systems reduce the thermal resistance of this thermal path while maintaining or lowering the weight of the system. Certain technical advantages of the present system include lower weight, lower thermal resistance, unlimited shapes and form factors, unitary single piece construction. Commercial advantages include custom designs, lower price, and more capability and greater thermal elements in the same volume.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects.

Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A thermal management system, comprising:
   a hollow vapor chamber containing a working fluid that conducts heat from a heat source to a cold reservoir, the hollow vapor chamber having an interior defining a vapor space to contain a vapor of the working fluid and having a non-porous exterior wall and a porous wick structure integrally formed with the non-porous exterior wall by an additive manufacturing process, the porous wick structure being in the interior of the hollow vapor chamber, wherein
   the non-porous exterior wall has a component side surface thermally coupled to a heat generating component of the heat source, the component side surface having a shape that at least partially conforms to at least one surface of the heat generating component, and
   a portion of the porous wick structure opposite the component side surface of the non-porous exterior wall directs the working fluid toward the heat generating component,
   wherein the hollow vapor chamber comprises curved integrally formed internal support posts formed by the additive manufacturing process that extends between opposing sides of the hollow vapor chamber, the internal support posts having a truss structure.

2. The thermal management system of claim 1, wherein the hollow vapor chamber further comprises a condenser integrally formed by the additive manufacturing process.

3. The thermal management system of claim 2, wherein the condenser comprises a plurality of hollow fins integrally formed with the hollow vapor chamber by the additive manufacturing process.

4. The thermal management system of claim 3, wherein the plurality of hollow fins are in fluidic communication with the vapor space.

5. The thermal management system of claim 1, wherein the porous wick structure has one or more of a non-uniform thickness, a non-uniform porosity, a non-uniform pore-size, or non-uniform permeability.

6. The thermal management system of claim 1, wherein the curved integrally formed internal support posts comprises the porous wick structure.

7. The thermal management system of claim 1, wherein the curved integrally formed internal support posts comprise non-porous solid portions.

8. The thermal management system of claim 1, wherein pores of the porous wick structure of the curved integrally formed internal support posts that are adjacent the opposing sides of the hollow vapor chamber are larger than pores that are between the opposing sides.

9. The thermal management system of claim 1, wherein pores of the porous wick structure on a liquid transport side adjacent the non-porous exterior wall are larger than pores on a vapor transport side adjacent the vapor space.

10. The thermal management system of claim 1, wherein the hollow vapor chamber comprises a plurality of ridges that permit elastic deformation of the hollow vapor chamber.

11. The thermal management system of claim 1, wherein the component side surface of the non-porous exterior wall is non-planar.

12. The thermal management system of claim 1, wherein the component side surface includes a mounting portion that retains the heat generating component of the heat source.

13. The thermal management system of claim 12, wherein the mounting portion retains the heat generating component by a friction fit.

14. The thermal management system of claim 1, wherein the additive manufacturing process comprises 3D printing, rapid prototyping, direct digital manufacturing, selective laser melting, electron beam melting, or direct metal laser melting.

* * * * *